(12) United States Patent
Han et al.

(10) Patent No.: US 12,260,808 B2
(45) Date of Patent: Mar. 25, 2025

(54) TRANSPARENT DISPLAY MODULE AND APPARATUS WITH MICRO-PIXEL PACKAGES MOUNTED ON TRANSPARENT SUBSTRATE

(71) Applicant: SAMSUNG ELECTRONICS CO., LTD., Suwon-si (KR)

(72) Inventors: Seungryong Han, Suwon-si (KR); Jaeseok Kim, Suwon-si (KR); Jaehoo Park, Suwon-si (KR); Sangkyun Im, Suwon-si (KR); Kilsoo Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/114,017

(22) Filed: Feb. 24, 2023

(65) Prior Publication Data

US 2023/0351946 A1    Nov. 2, 2023

Related U.S. Application Data

(63) Continuation of application No. PCT/KR2023/001096, filed on Jan. 25, 2023.

(30) Foreign Application Priority Data

Apr. 29, 2022 (KR) .................. 10-2022-0053791
Jul. 29, 2022 (KR) .................. 10-2022-0095048

(51) Int. Cl.
*G09G 3/32* (2016.01)
*G09F 9/302* (2006.01)
(Continued)

(52) U.S. Cl.
CPC .............. *G09G 3/32* (2013.01); *G09F 9/3026* (2013.01); *H01L 25/0753* (2013.01);
(Continued)

(58) Field of Classification Search
CPC ....... G09G 3/32; H01L 25/073; H01L 27/156; H01L 25/0753; H01L 25/167
See application file for complete search history.

(56) References Cited

U.S. PATENT DOCUMENTS 10,403,200 B2    9/2019    Xu et al.
11,436,970 B2    9/2022    Gray et al.
(Continued)

FOREIGN PATENT DOCUMENTS

KR    10-1971979 B1    4/2019
KR    10-2115813 B1    5/2020
(Continued)

OTHER PUBLICATIONS

KR-102219252B1 translation (Year: 2021).*
(Continued)

*Primary Examiner* — Liliana Cerullo
(74) *Attorney, Agent, or Firm* — Sughrue Mion, PLLC

(57) ABSTRACT

A transparent display module includes: a transparent substrate; a line pattern provided on the transparent substrate in a form of a two-dimensional grid; a plurality of micro-pixel integrated circuits (ICs) provided on the line pattern; a plurality of inorganic light emitting elements provided on the line pattern or the plurality of micro-pixel ICs; a plurality of transparent areas formed in areas in which the line pattern is not provided, and at least one pixel circuit configured to supply a driving current to the plurality of inorganic light emitting elements.

15 Claims, 23 Drawing Sheets

(51) Int. Cl.
*H01L 25/075* (2006.01)
*H01L 27/15* (2006.01)

(52) U.S. Cl.
CPC ... *H01L 27/156* (2013.01); *G09G 2310/0267* (2013.01); *G09G 2310/0275* (2013.01)

(56) References Cited

U.S. PATENT DOCUMENTS

| | | | | |
|---|---|---|---|---|
| 2012/0256814 | A1* | 10/2012 | Ootorii | G09G 3/3208 345/82 |
| 2020/0312220 | A1* | 10/2020 | Hussell | F21V 23/007 |
| 2020/0350361 | A1* | 11/2020 | Tao | G09G 3/32 |
| 2021/0320228 | A1* | 10/2021 | Kwon | H01L 25/167 |
| 2021/0398479 | A1* | 12/2021 | Kim | H01L 25/162 |
| 2022/0020310 | A1* | 1/2022 | Gray | G09G 3/2088 |

FOREIGN PATENT DOCUMENTS

| | | | |
|---|---|---|---|
| KR | 10-2114406 B1 | 6/2020 | |
| KR | 102219252 B1 * | 2/2021 | ............ H01L 33/62 |
| KR | 10-2276372 B1 | 7/2021 | |
| KR | 10-2021-0125220 A | 10/2021 | |
| KR | 10-2022-0009902 A | 1/2022 | |

OTHER PUBLICATIONS

International Search Report and Written Opinion (PCT/ISA/210 and PCT/ISA/237) dated May 19, 2023, issued by International Searching Authority for International Application No. PCT/KR2023/001096.

* cited by examiner

FIG. 10
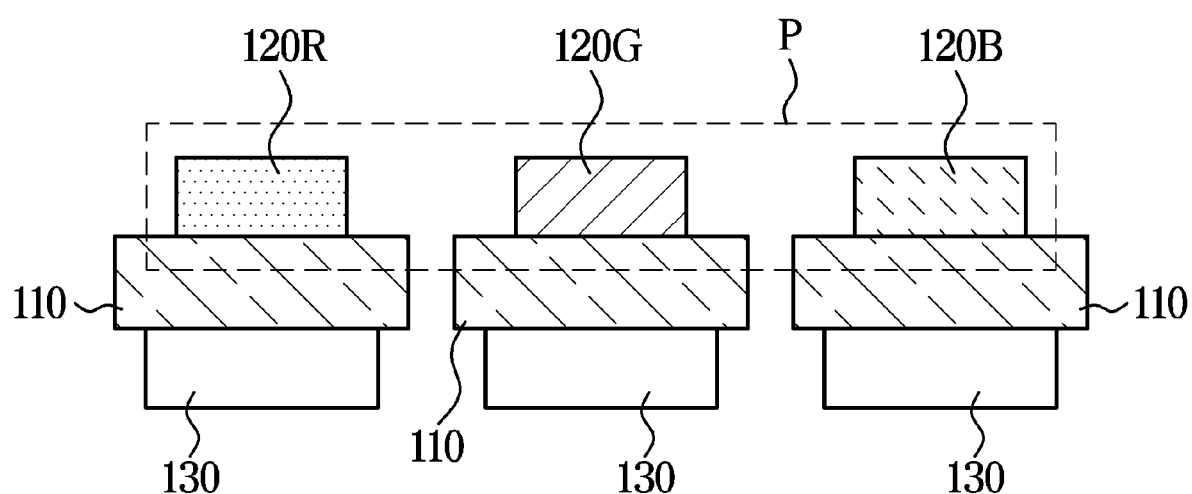
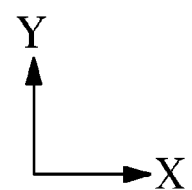

FIG. 14
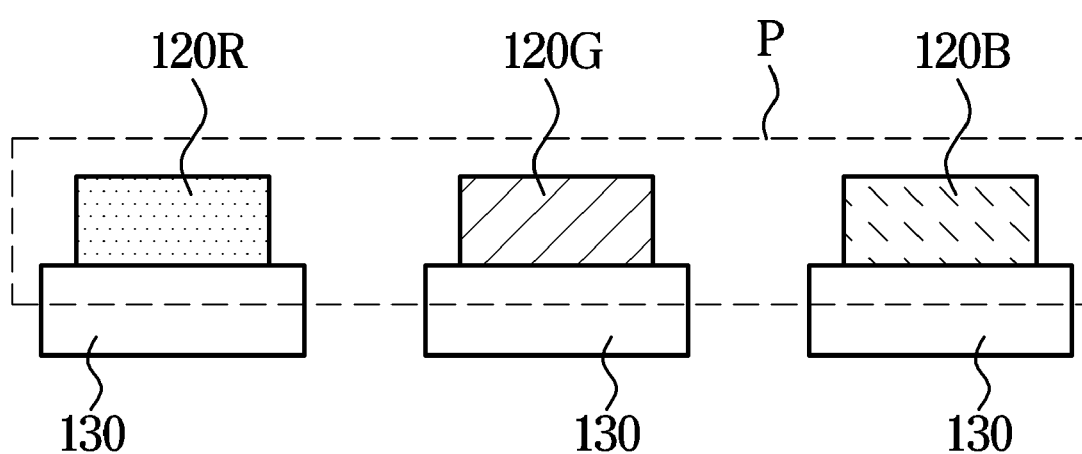
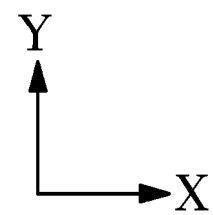

TRANSPARENT DISPLAY MODULE AND APPARATUS WITH MICRO-PIXEL PACKAGES MOUNTED ON TRANSPARENT SUBSTRATE

CROSS-REFERENCE TO RELATED APPLICATION

This application is a by-pass continuation application of International Application No. PCT/KR2023/001096, filed on Jan. 25, 2023 which claims priority to Korean Patent Application No. 10-2022-0095048, filed on Jul. 29, 2022, and Korean Patent Application No. 10-2022-0053791, filed on Apr. 29, 2022 in the Korean Intellectual Property Office, the disclosure of each of which are incorporated by reference herein in their entirety.

BACKGROUND

1. Field

The disclosure relates to a transparent display module and a transparent display apparatus.

2. Description of the Related Art

A display apparatus may be classified into (i) a self-emitting display in which each pixel emits light by itself or (ii) a passive light-emitting display that requires a separate light source.

A liquid crystal display (LCD) is a typical passive light-emitting display, and needs at least a backlight unit configured to supply light from the rear of a display panel, a liquid crystal layer configured to serve as a switch to transmit/block light, and a color filter configured to change supplied light to a desired color. Thus, the LCD has a complex structure that complicates reducing a thickness of the LCD.

On the other hand, in the self-emitting display in which each pixel emits light by itself via a light-emitting element for each pixel, components such as a backlight unit and a liquid crystal layer are not required, and a color filter may also be omitted. Thus, the self-emitting display is structurally more simple than the passive light-emitting display, and may have a high degree of freedom in design. In addition, the self-emitting display may realize not only a small thickness, but also an excellent contrast ratio, brightness, and viewing angle.

Among self-emitting displays, a micro light-emitting diode (LED) display is composed of a plurality of LEDs each having a size of micrometers. In comparison with the LCD that requires a backlight, the micro-LED display may provide better contrast, response time, and energy efficiency.

Further, the micro-LED, which is an inorganic light-emitting element, has higher brightness, better light emission efficiency, and a longer lifespan in comparison with an organic light-emitting diode (OLED), which requires a separate encapsulation layer for protecting organic materials. Accordingly, these features make reduction of a display device more difficult. Furthermore, the configurations of current display devices makes inspection and detection of defective components difficult.

SUMMARY

According to one or more embodiments, a transparent display module, includes: a transparent substrate; a line pattern provided on the transparent substrate in a form of a two-dimensional grid; a plurality of micro-pixel integrated circuits (ICs) provided on the line pattern; a plurality of inorganic light emitting elements provided on the line pattern or the plurality of micro-pixel ICs; a plurality of transparent areas formed in areas in which the line pattern is not provided; and at least one pixel circuit configured to supply a driving current to the plurality of inorganic light emitting elements.

The transparent display module further comprises a micro-pixel package provided on the line pattern, where the micro-pixel package includes: a relay substrate, the plurality of inorganic light emitting elements disposed at an upper side of the relay substrate, and a micro-pixel IC from the plurality of micro-pixel ICs that is disposed at a lower side of the relay substrate.

The transparent display module further comprises a micro-pixel package provided on the line pattern, where the micro-pixel package includes: a micro-pixel IC from the plurality of micro-pixel ICs, and the plurality of inorganic light emitting elements mounted on an upper surface of the single micro-pixel IC.

The plurality of inorganic light emitting elements constitute a plurality of pixels that are two-dimensionally arranged, where each of the plurality of pixels includes two or more inorganic light emitting elements among the plurality of inorganic light emitting elements.

The plurality of micro-pixel ICs correspond to the plurality of pixels, respectively, and the plurality of inorganic light emitting elements are supplied with the driving current from a corresponding micro-pixel IC.

The at least one micro-pixel IC of the plurality of micro-pixel ICs supplies the driving current to two or more pixels from the plurality of pixels.

A number of micro-pixel ICs in the plurality of micro-pixel ICs is smaller than a number of pixels in the plurality of pixels.

The at least one micro-pixel IC of the plurality of micro-pixel ICs supplies the driving current to at least one pixel adjacent thereto from the plurality of pixels through the line pattern.

The line pattern transfers a gate signal and a data signal for image display to the plurality of micro-pixel ICs.

The transparent display module of claim 9, wherein the at least one micro-pixel IC of the plurality of micro-pixel ICs further includes an IC control circuit configured to distribute the transferred gate signal and data signal to two or more pixel circuits that supply driving currents to the two or more pixels, respectively.

According to one or more embodiments, a transparent display apparatus comprises: at least one display module; and a driver integrated circuit (IC) configured to generate a driving signal to be supplied to the at least one display module, where the at least one display module includes: a transparent substrate, a line pattern provided on the transparent substrate in a form of a two-dimensional grid, a plurality of micro-pixel integrated circuits (ICs) provided on the line pattern, a plurality of inorganic light emitting elements provided on the line pattern or the plurality of micro-pixel ICs, a plurality of transparent areas formed in areas in which the line pattern is not provided, at least one pixel circuit configured to supply a driving current to the plurality of inorganic light emitting elements.

The transparent display apparatus further comprises a micro-pixel package provided on the line pattern, where the micro-pixel package includes: a relay substrate, the plurality of inorganic light emitting elements disposed at an upper side of the relay substrate, and a micro-pixel IC from the plurality of micro-pixel ICs that is disposed at a lower side of the relay substrate.

The transparent display apparatus further comprises a micro-pixel package provided on the line pattern, where the micro-pixel package includes: a micro-pixel IC from the plurality of micro-pixel ICs; and the plurality of inorganic light emitting elements mounted on an upper surface of the single micro-pixel IC.

The plurality of inorganic light emitting elements constitute a plurality of pixels that are two-dimensionally arranged, where each of the plurality of pixels includes two or more inorganic light emitting elements among the plurality of inorganic light emitting elements.

The plurality of micro-pixel ICs corresponds to the plurality of pixels, respectively, and the plurality of inorganic light emitting elements are supplied with the driving current from a corresponding micro-pixel IC.

According to one or more embodiments, a transparent display module, comprises: a transparent substrate; a line pattern provided on the transparent; a plurality of micro-pixel packages, each micro-pixel package including: at least one micro-pixel IC integrated circuit (ICs) provided on the line pattern, at least one inorganic light emitting element provided on the line pattern or the at least one micro-pixel IC; a plurality of transparent areas formed in areas in which the line pattern is not provided, and at least one pixel circuit configured to supply a driving current to the at least one inorganic light emitting element included in each micro-pixel package.

Each micro-pixel package includes: a relay substrate, where the at least one inorganic light emitting element is disposed at an upper side of the relay substrate, and the at least one micro-pixel IC is disposed at a lower side of the relay substrate.

For each micro-pixel package, the at least one inorganic light emitting element is mounted on an upper surface of the at least one micro-pixel IC.

The at least one inorganic light emitting element constitutes at least one pixel, where the at least one pixel includes two or more inorganic light emitting elements.

For each micro-pixel package, the at least one inorganic light emitting element is supplied with a driving current from the at least one micro-pixel IC.

BRIEF DESCRIPTION OF THE DRAWINGS

FIGS. 8 to 10 are diagrams illustrating an example applicable to a structure of a single micro-pixel package, in a display module according to one or more embodiments.

FIGS. 13 to 15 are diagrams illustrating a case in which a plurality of inorganic light emitting elements are directly mounted on a micro-pixel IC, in a display module according to one or more embodiments.

DETAILED DESCRIPTION

Figure 1:
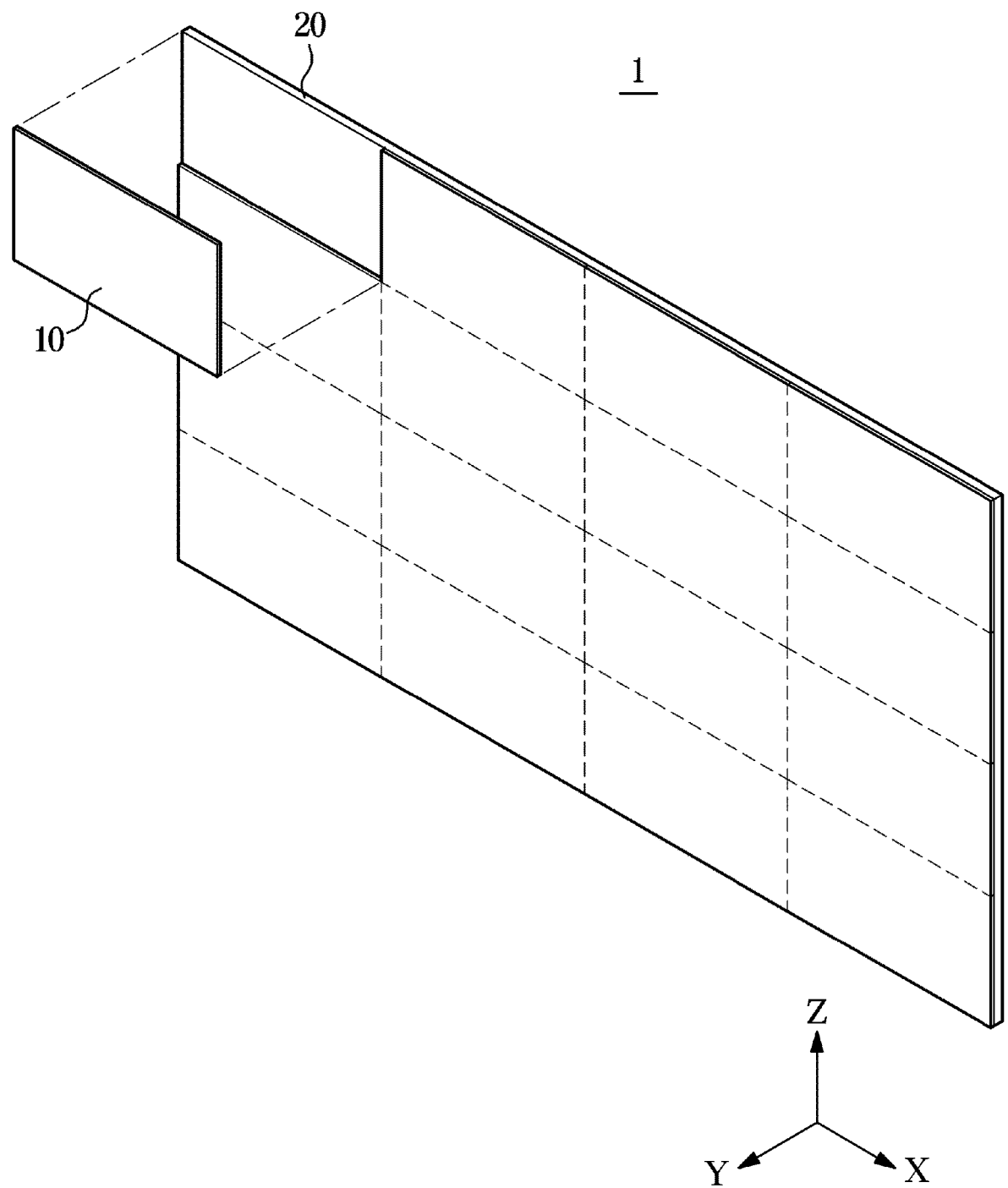
FIGS. 1 and 2 are perspective views illustrating an example of a display module and a display apparatus including the same, according to one or more embodiments.

Embodiments disclosed in the present specification and the components shown in the drawings are merely exemplary embodiments of the disclosed invention and various modifications capable of replacing the embodiments and drawings of the present specification may be made at the time of filing the present application.

Further, terms used herein are used to illustrate the embodiments and are not intended to limit and/or to restrict the disclosed invention. As used herein, singular forms are intended to include plural forms as well, unless the context clearly indicates otherwise.

Terms "comprise," "is provided with," "have," and the like are used herein to specify the presence of stated features, numerals, steps, operations, components, parts or combinations thereof but do not preclude the presence or addition of one or more other features, numerals, steps, operations, components, parts, or combinations thereof.

Further, terms such as "unit," "portion," "block," "member," "module" may refer to a unit of processing at least one function or operation. For example, these terms may refer to at least one process implemented by software, a hardware component such as a field-programmable gate array (FPGA)/an application-specific integrated circuit (ASIC), or a combination of software and hardware.

In addition, the ordinal numbers, such as "first ~" and "second ~" used in front of the components described in the specification are only used to distinguish the components from each other without having other meanings, such as the order of connection and use between the components, priority, etc.

A reference numeral attached in each of operations is used to identify each of the operations, and this reference numeral does not describe the order of the operations, and the operations may be performed differently from the described order unless clearly specified in the context.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 2:
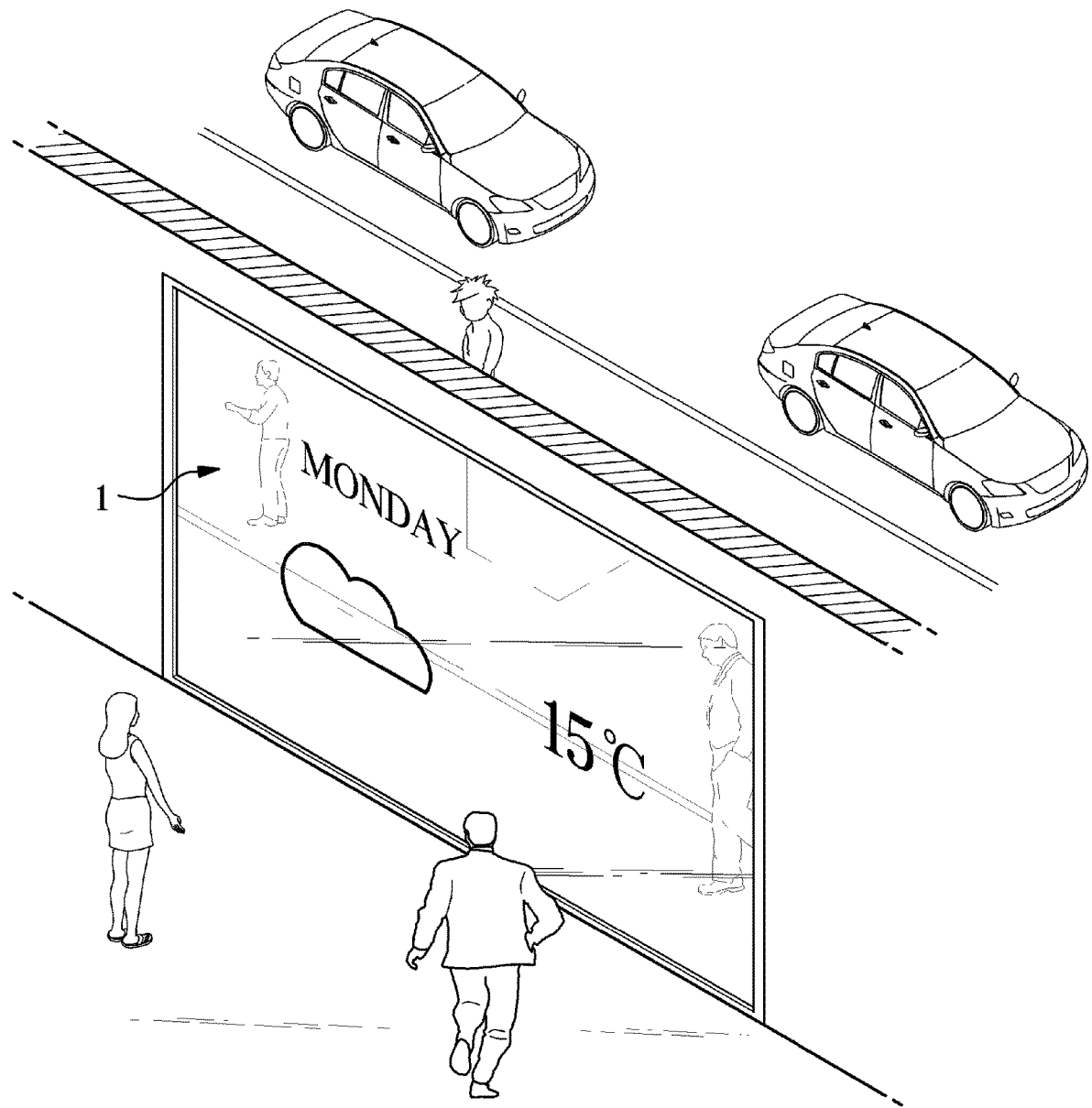

Hereinafter, a display module and a display apparatus according to an aspect will be described in detail with reference to the accompanying drawings. FIGS. 1 and 2 are perspective views illustrating an example of a display module according to one or more embodiments and a display apparatus having the same.

A display apparatus 1, according to one or more embodiments, may be a self-emitting display apparatus in which a light-emitting element is disposed for each pixel so that each pixel may emit light by itself. Accordingly, unlike a liquid crystal display (LCD) apparatus, since a component such as a backlight unit, a liquid crystal layer, or the like is not required, it is possible to realize a small thickness, and various design changes are possible due to the simple structure.

Further, the display apparatus 1, according to one or more embodiments may employ an inorganic light-emitting element, such as an inorganic light-emitting diode (LED), as the light-emitting element disposed in each pixel. The inorganic light-emitting element has a faster response speed than an organic light-emitting element such as an organic light-emitting diode (OLED), and may realize high luminance with low power.

Furthermore, in comparison with the organic light-emitting element that requires an encapsulation process because the organic light-emitting element is vulnerable to exposure to moisture and oxygen and has poor durability, the inorganic light-emitting element does not require the encapsulation process and has better durability. Hereinafter, the inorganic light-emitting element mentioned in the one or more embodiments described below means an inorganic LED.

The inorganic light-emitting element employed in the display apparatus 1, according to one or more embodiments may be a micro-LED having a short side length of about 100 μm, several tens of μm, or several μm. As described above, by employing the micro-scale LED, a pixel size may be advantageously reduced, and a higher resolution may be realized within the same size screen.

Furthermore, when an LED chip is manufactured in the size of a micro unit, it is possible to solve a problem in which the LED chip is broken due to characteristics of inorganic materials upon being bent. For example, when the micro-LED chip is transferred to a flexible substrate, the LED chip is not broken, even when the substrate is bent, so that the display apparatus may be implemented as a flexible display apparatus.

A display apparatus employing a micro-LED may be applied to various fields by using a very small pixel size and a thin thickness. As an example, as shown in FIG. 1, by tiling a plurality of display modules 10, to each of which a plurality of micro-LEDs are transferred, and by fixing the plurality of display modules 10 to a body 20, it is possible to implement a large-area screen, and a display apparatus of the large-area screen may be used as a signage, an electric billboard, or any other field known to one of ordinary skill in the art requiring an application.

According to one or more embodiments, based on the feature of flexibility, the display apparatus may be implemented as a foldable display apparatus, a rollable display apparatus, or any other flexible structure known to one of ordinary skill in the art.

In addition, as shown in FIG. 2, the display apparatus 1 according to one or more embodiments may be implemented as a transparent display apparatus. The transparent display apparatus is obtained by disposing circuit elements for realizing an image on a transparent substrate, and thus, not only an image displayed on the transparent display apparatus but also objects over the image may be viewed.

The display apparatus 1, according to one or more embodiments, does not require a backlight unit, a liquid crystal layer, or an encapsulation layer, and only requires a ultra-small micro LED and a driving circuit and wires for driving the micro LED and thus, is beneficial in securing the aperture ratio, which is an important factor in implementing a transparent display apparatus.

In the embodiments described below, it is assumed that the display apparatus 1 is implemented as a transparent display apparatus.

A three-dimensional coordinate system of XYZ axes shown in FIGS. 1 and 2 may be based on the display apparatus 1, a plane on which a screen of the display apparatus 1 is located is an XZ plane, and a direction in which an image is output or an inorganic light-emitting element emits light is a +Y direction. Since the coordinate system may be based on the display apparatus 1, the same coordinate system may be applied to both cases in which the display apparatus 1 is lying down and the display apparatus 1 is upright.

In general, the display apparatus 1 may be used in an upright state, where a user views an image in the front of the display apparatus 1 so that the +Y direction in which the image is output is referred to as a front side, and a direction opposite to the front side may be referred to as a rear side.

Further, the display apparatus 1 may be manufactured in a state of lying down. Accordingly, a −Y direction of the display apparatus 1 may be referred to as a downward direction, and the +Y direction may be referred to as an upward direction. For example, in accordance with one or more embodiments to be described below, the +Y direction may be referred to as the upward direction, or may also be referred to as the front side, and the −Y direction may be referred to as the downward direction, or may also be referred to as the rear side.

The other four surfaces, except for an upper surface and a lower surface of the flat-panel-type display apparatus 1, or display module 10, may be referred to as side surfaces regardless of a posture of the display apparatus 1 or the display module 10.

In the example of FIG. 1, the display apparatus 1 may be illustrated as implementing a large-area screen by including the plurality of display modules, but the embodiments of the display apparatus 1 are not limited thereto. The display apparatus 1 may also be implemented as a television (TV), a wearable device, a portable device, a monitor for a personal computer (PC), or any other display apparatus known to one of ordinary skill in the art by including a single display module 10.

The display apparatus 10 may include a two dimensional arrangement of a plurality of pixels. A unit pixel may be composed of at least three sub-pixels outputting light of different colors. For example, the unit pixel may include a read sub-pixel to output red light, a green sub-pixel to output green light, and a blue sub-pixel to output blue light.

The sub-pixels may be arranged along a X-axis direction, may be arranged along a Z-axis direction, or may not be arranged in a line. Furthermore, the sub-pixels may be implemented to have different sizes. In order to implement a plurality of colors, a single pixel may only need to include a plurality of sub-pixels, and there is no limitation on a size of each sub-pixel or an arrangement method of the sub-pixels.

Further, the pixel does not need to be composed of the red sub-pixel configured to output red light, the green sub-pixel configured to output green light, and the blue sub-pixel configured to output blue light, and may include a sub-pixel configured to output yellow light or white light. For example, there is no limitation on the color or type of light output from each sub-pixel and the number of sub-pixels.

However, in the embodiments described below, for detailed description, the case in which the unit pixel includes the red sub-pixel, the green sub-pixel, and the blue sub-pixel will be described as an example.

As described above, each of the display module 10 and the display apparatus 1, according to one or more embodiments, may be a self-emitting display apparatus in which each pixel may emit light by itself. Accordingly, an inorganic light-emitting element that emits light of different colors may be disposed in each sub-pixel. For example, a red inorganic light-emitting element may be disposed in the red sub-pixel, a green inorganic light-emitting element may be disposed in the green sub-pixel, and a blue inorganic light-emitting element may be disposed in the blue sub-pixel.

Accordingly, in one or more embodiments, the pixel may represent a cluster including the red inorganic light-emitting element, the green inorganic light-emitting element, and the blue inorganic light-emitting element, and the sub-pixel may represent each inorganic light-emitting element.

Figure 3:
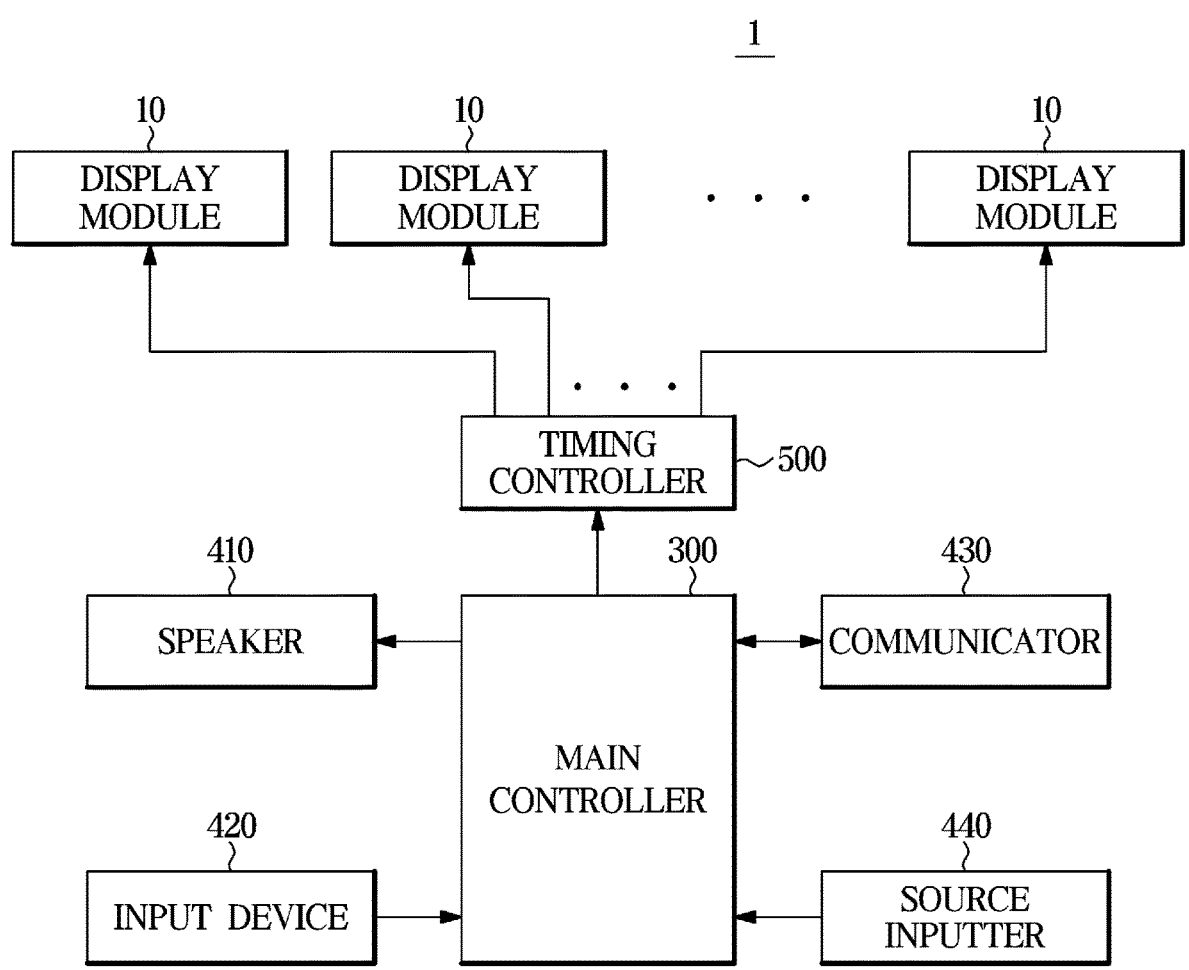
FIG. 3 is a control block diagram illustrating a display apparatus according to one or more embodiments.

FIG. 3 is a control block diagram of the display apparatus 1, according to one or more embodiments.

As described above with reference to FIG. 1, the display apparatus 1, according to one or more embodiments, may include a plurality of display modules 10, a main controller 300 and a timing controller 500 that are configured to control the plurality of display modules 10, a communicator 430 configured to communicate with an external device, a source inputter 440 configured to receive a source image, a speaker 410 configured to output sound, and an input device 420 configured to receive a command for controlling the display apparatus 1 from a user.

The input device 420 may include a button or a touch pad provided in one area of the display apparatus 1, and when a display panel 11 is implemented as a touch screen, the input device 420 may include a touch pad provided on a front surface of the display panel 11. In addition, the input device 420 may also include a remote controller.

The input device 420 may receive various commands for controlling the display apparatus 1, such as power on/off, volume adjustment, channel adjustment, screen adjustment, various setting changes, or any other command known to one of ordinary skill in the art, from the user.

The speaker 410 may be provided in one area of the body 20, and a separate speaker module physically separated from the body 20 may be further provided.

The communicator 430 may transmit and receive necessary data by performing communication with a relay server or other electronic devices. The communicator 430 may employ at least one of various wireless communication methods, such as 3rd Generation (3G), 4th Generation (4G), wireless local area network (LAN), Wi-Fi, Bluetooth, Zigbee, Wi-Fi Direct (WFD), ultra-wide band (UWB), infrared data association (IrDA), Bluetooth low energy (BLE), near field communication (NFC), Z-wave, or any other communication method known to one of ordinary skill in the art. In addition, the communicator 430 may employ a wired communication method such as peripheral component interconnect (PCI), PCI-express, or universal serial bus (USB).

The source inputter 440 may receive a source signal input from a set-top box, a USB, an antenna, or any other device known to one of ordinary skill in the art that generates a source signal. Accordingly, the source inputter 440 may include at least one selected from a source input interface group including a high-definition multimedia interface (HDMI) cable port, a USB port, an antenna, or any other source input known to one of ordinary skill in the art.

The source signal received by the source inputter 440 may be processed by the main controller 300 to be converted into a form that may be output by the display panel 11 and the speaker 410.

The main controller 300 and the timing controller 500 may include at least one memory, which may be configured to store programs for performing operations to be described below and various types of data, and at least one processor configured to execute the stored programs.

The main controller 300 may process the source signal input through the source inputter 440 to generate an image signal corresponding to the input source signal.

For example, the main controller 300 may include a source decoder, a scaler, an image enhancer, and a graphics processor. The source decoder may decode a source signal compressed in a format such as a Motion Picture Experts Group (MPEG) format, and the scaler may output image data of a desired resolution through resolution conversion.

The image enhancer may advantageously improve the image quality of the image data by applying various correction techniques. The graphics processor may classify pixel of the image data into RGB data and output a control signal such as a syncing signal for display timing in the display panel 11. For example, the main controller 300 may output image data, which corresponds to the source signal, and a control signal.

The above-described operation of the main controller 300 is merely an example applicable to the display apparatus 1, and as understood by one of ordinary skill in the art, the main controller 300 may further perform other operations, or some of the operations described above may be omitted.

The image data and the control signal output from the main controller 300 may be transmitted to the timing controller 500.

The timing controller 500 may convert the image data transmitted from the main controller 300 into image data of a format that may be processed in a driver integrated circuit (IC) 200, and generate various control signals such as a timing control signal necessary for displaying the image data on the display panel 11.

The display apparatus 1, according to one or more embodiments does not need to include the plurality of display modules 10, but in the embodiments described below, for detailed description, operations of each component of the display apparatus 1 including the plurality of display modules 10 will be described as an example in detail.

Figure 4:
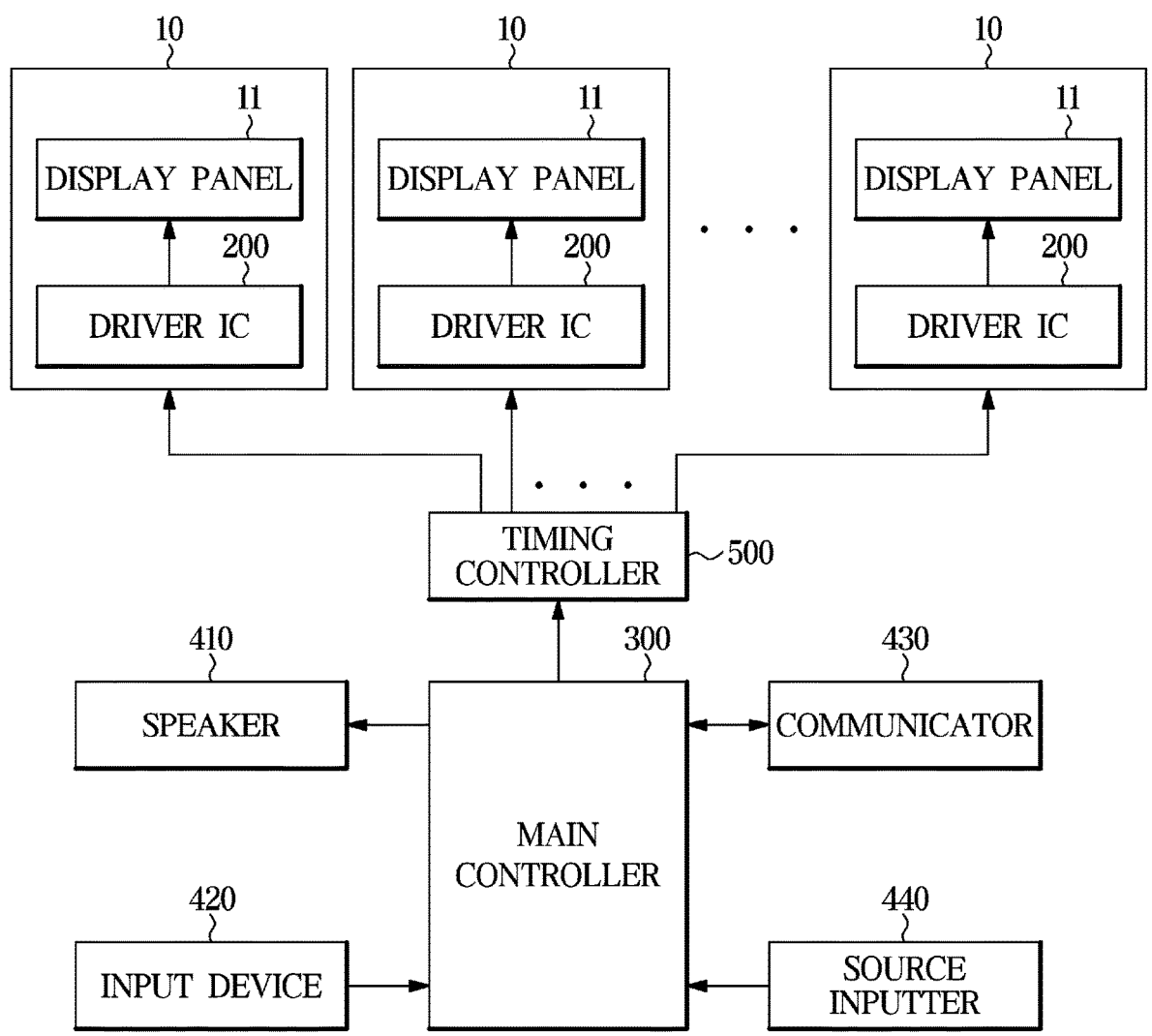
FIG. 4 is a control block diagram specifically illustrating a configuration of a display module included in a display apparatus according to one or more embodiments.

FIG. 4 is a control block diagram specifically illustrating a configuration of a display module included in a display apparatus according to one or more embodiments.

Referring to FIG. 4, each of the plurality of display modules 10 may include the display panel 11 configured to display an image and the driver IC 200 configured to drive the display panel 11. Each of the plurality of display modules 10 may be a transparent display module for implementing a transparent display apparatus.

The driver IC 200 may generate a driving signal based on the image data and the timing control signal transmitted from the timing controller 500 so that the display panel 11 displays an image.

The driving signal generated by the driver IC 200 may include a gate signal and a data signal, and the generated driving signal may be input to the display panel 11.

The display apparatus 1, according to one or more embodiments. is a self-emitting display apparatus in which each pixel may emit light by itself. Accordingly, the inorganic light-emitting element 120 may be disposed in each sub-pixel. That is, each of the plurality of pixels may include two or more inorganic light-emitting elements 120.

Each of the inorganic light-emitting elements 120 may be driven by an active matrix (AM) method or a passive matrix (PM) method, but in the embodiments to be described below, for detailed description, a case in which the inorganic light-emitting element 120 is driven by the AM method will be described as an example.

In the display module 10, according to one or more embodiments, each inorganic light-emitting element 120 may be individually controlled by the pixel circuit, and each of the pixel circuits may operate in response to the driving signal output from the driver IC 200.

Figure 5:
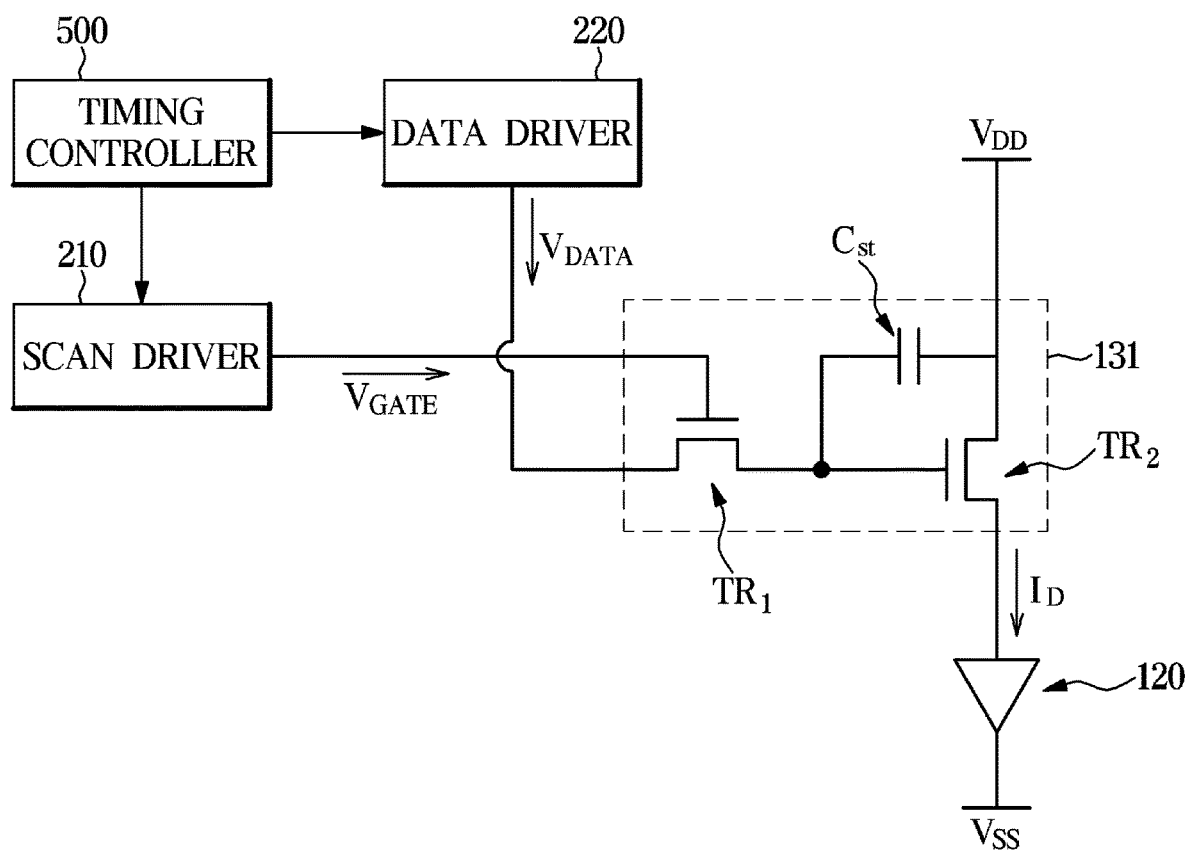
FIG. 5 is a diagram conceptually illustrating a method in which each pixel is driven in a display module according to one or more embodiments.

FIG. 5 is a diagram conceptually illustrating a method in which each pixel is driven in a display module, according to one or more embodiments.

Referring to FIG. 5, the driver IC 200 may include a scan driver 210 and a data driver 220. The scan driver 210 may output a gate signal for turning the sub-pixel on/off, and the data driver 220 may output a data signal for implementing (e.g., display) an image. The scan driver 210 may generate the gate signal based on the control signal transmitted from the timing controller 500, and the data driver 220 may generate the data signal based on the image data transmitted from the timing controller 500. For example, the timing controller may send one or more pulses having a predetermined frequency for operating the scan driver 210 and/or the data driver 220.

The gate signal output from the scan driver 210 and the data signal output from the data driver 220 may be input to the pixel circuit 131.

For example, when a gate voltage $V_{GATE}$, a data voltage $V_{DATA}$, and the power supply voltage $V_{DD}$ are input to the pixel circuit 131, the pixel circuit 131 may output a driving current $I_D$ for driving the inorganic light-emitting element 120.

The driving current $I_D$ output from the pixel circuit 131 may be input to the inorganic light-emitting element 120, and the inorganic light-emitting element 120 may emit light due to the input driving current $I_D$ to implement an image.

The pixel circuit 131 may include transistors $TR_1$ and $TR_2$ configured to switch or drive the inorganic light-emitting element 120 and a capacitor $C_{ST}$. As described above, the inorganic light-emitting element 120 may be a micro-LED.

For example, the transistors $TR_1$ and $TR_2$ may include a switching transistor $TR_1$ and a driving transistor $TR_2$, and the switching transistor $TR_1$ and the driving transistor $TR_2$ may be implemented as at least one of a P-type metal oxide semiconductor (PMOS) type transistor, a N-type metal oxide semiconductor (NMOS) type transistor, a complementary metal-oxide-semiconductor (CMOS) type transistor, or any other semiconductor circuit structure known to one of ordinary skill in the art.

In addition, the transistors $TR_1$ and $TR_2$ may be thin film transistors (TFTs). For example, the transistors $TR_1$ and $TR_2$ may be implemented as at least one of an a-Si TFT, a low-temperature poly silicon (LTPS) TFT, an oxide TFT, or any other TFT structure known to one of ordinary skill in the art.

The switching transistor $TR_1$ has a gate electrode connected to the scan driver 210, a source electrode connected to the data driver 220, and a drain electrode connected to one end of the capacitor $C_{ST}$ and a gate electrode of the driving transistor $TR_2$. The power supply voltage $V_{DD}$ may be applied through the other end of the capacitor $C_{ST}$.

Furthermore, the power supply voltage $V_{DD}$ may be applied to a source electrode of the driving transistor $TR_2$, and a drain electrode of the driving transistor $TR_2$ may be connected to an anode of the inorganic light-emitting element 120. The reference voltage $V_{SS}$ may be connected to a cathode of the inorganic light-emitting element 120. The reference voltage $V_{SS}$ may be a voltage lower than the power supply voltage $V_{DD}$, and a ground voltage or any other suitable voltage value may be used as the reference voltage $V_{SS}$ to provide the ground.

The pixel circuit 131 of the above-described structure may operate as described below. First, when the gate voltage $V_{GATE}$ is applied from the scan driver 210 to turn the switching transistor $TR_1$ on, the data voltage $V_{DATA}$ applied from the data driver 220 may be transmitted to one end of the capacitor $C_{ST}$, and the gate electrode of the driving transistor $TR_2$.

A voltage corresponding to a gate-source voltage $V_{GS}$ of the driving transistor $TR_2$ may be maintained for a predetermined time due to the capacitor $C_{ST}$. The driving transistor $TR_2$ may apply the driving current $C_D$ corresponding to the gate-source voltage $V_{GS}$ to the anode of the inorganic light-emitting element 120, thereby causing the inorganic light-emitting element 120 to emit light.

However, the above-described structure of the pixel circuit 131 is merely an example applicable to the display module 10, according to one or more embodiments, and various circuit structures for switching and driving the plurality of inorganic light-emitting elements 120 may be applied to the display module 10 in addition to the above example.

Further, in one or more embodiments, a brightness control method of the inorganic light-emitting element 120 is not limited. The brightness of the inorganic light-emitting element 120 may be controlled by one of various methods, such as a pulse amplitude modulation (PAM) method, a pulse width modulation (PWM) method, and a hybrid method combining the PAM method and the PWM method.

Figure 6:
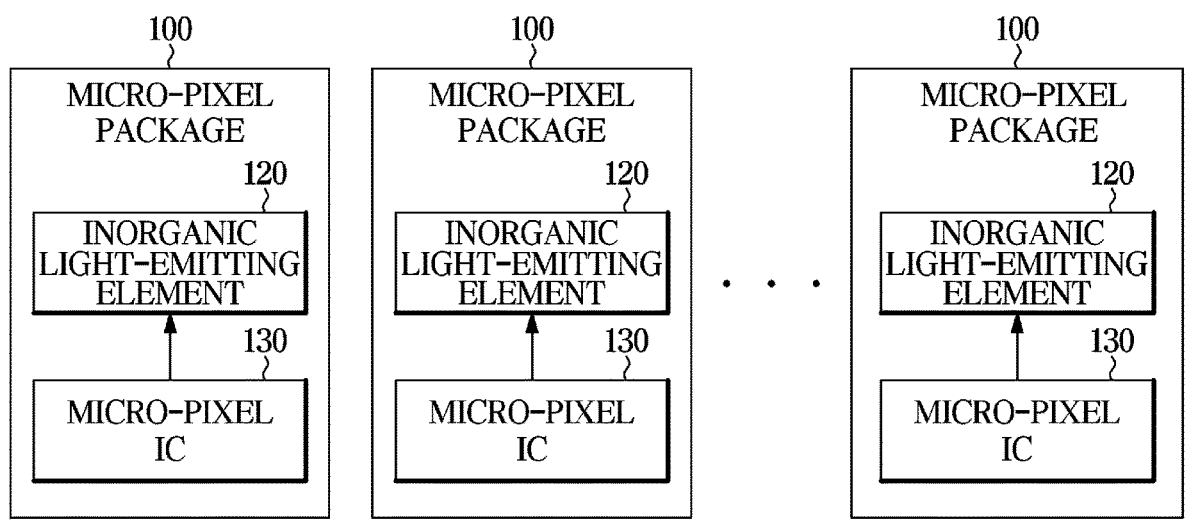
FIGS. 6 and 7 are block diagrams specifically illustrating a configuration of a display panel, in a display module according to one or more embodiments.
Figure 7:
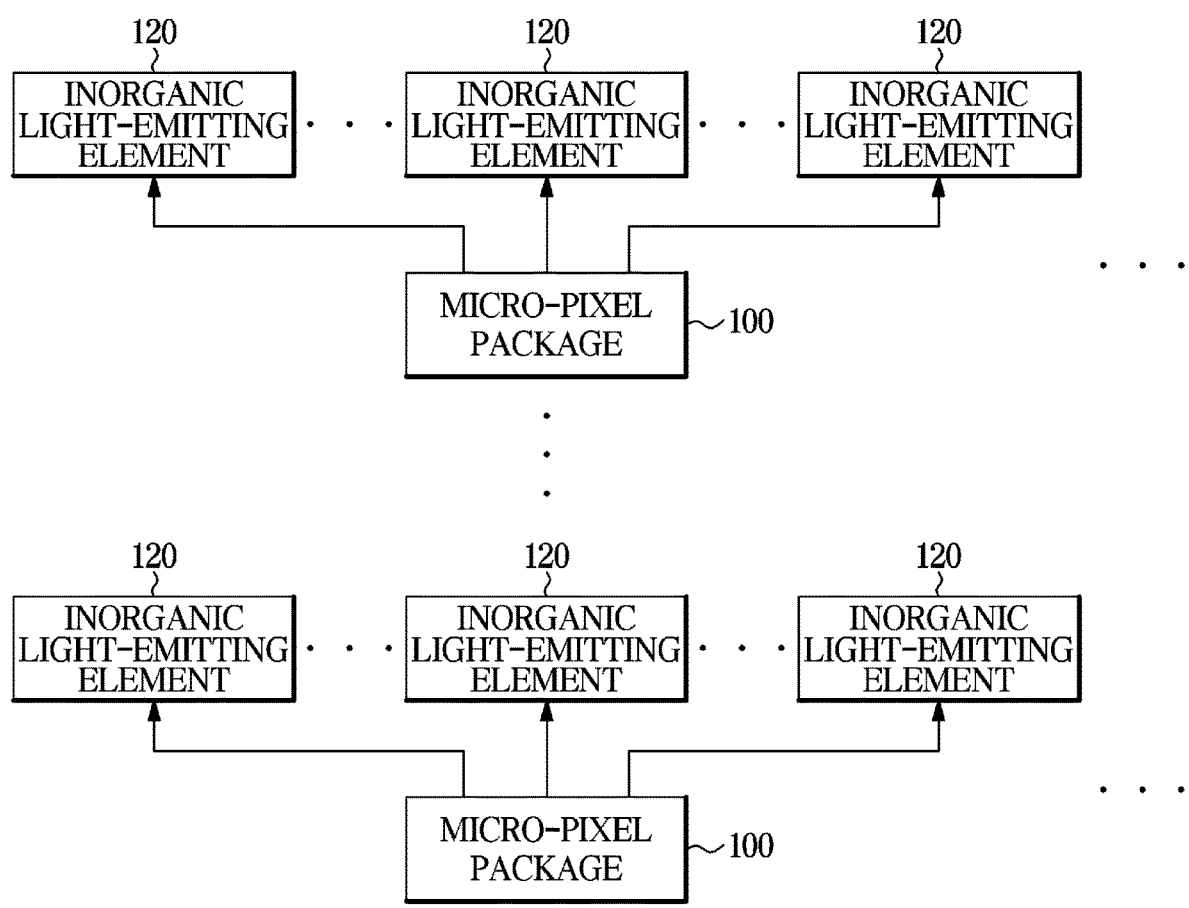

FIGS. 6 and 7 are block diagrams specifically illustrating a configuration of a display panel, in a display module according to one or more embodiments.

Referring to FIG. 6, the display panel 11 may include a plurality of micro-pixel packages 100, and each of the plurality of micro-pixel packages 100 may include an inorganic light emitting element 120 and a micro-pixel IC 130.

A single micro-pixel package 100 may include a single micro-pixel IC 130 and at least one inorganic light emitting element 120. For example, a single micro-pixel IC 130 may drive a single pixel, and to this end, three inorganic light emitting elements 120, respectively representing red, green, and blue colors may be included in a single micro-pixel package. As another example, a single micro-pixel IC 130 may drive a single subpixel, and an inorganic light emitting element 120 representing one of red, green, and blue may be included in a single micro-pixel package.

Each of the micro-pixel ICs 130 may be provided with the pixel circuit 131 described above (FIG. 5). For example, in the display module 10, according to one or more embodiments, it is not that a TFT substrate is implemented by forming a TFT circuit on the entire transparent substrate 13 (e.g., see FIG. 16), and the inorganic light emitting elements 120 are subsequently mounted, but that the micro-pixel IC 130 for driving at least one pixel may be separately manufactured and subsequently connected to the inorganic light emitting elements to implement a single micro-pixel package.

According to one or more embodiments, the micro-pixel ICs 130 may be individually subject to circuit inspection, and only a micro-pixel IC 130 determined to be a good product through the circuit inspection may be mounted on the display module 10. Therefore, compared to the case in which the thin film transistor circuit is directly mounted on the transparent substrate 13, ease of circuit inspection and replacement of defective products is advantageously ensured.

As will be described below, the plurality of inorganic light emitting elements 120 controlled by the micro-pixel IC 130 may be mounted on the micro-pixel IC 130, or may be mounted on a separate relay substrate that connects the inorganic light emitting elements 120 to the micro-pixel IC 130. In the latter case, the micro-pixel IC 130 may be mounted on the lower side of the relay substrate.

As described above, when the micro-pixel IC 130 and the plurality of inorganic light emitting elements 120 are stacked in the vertical direction, the area occupied by the micro-pixel IC 130 and the plurality of inorganic light emitting elements 120 on the transparent substrate 13 is advantageously reduced and an aperture ratio of the transparent substrate 13 is increased. An aperture ratio in a transparent display apparatus may indicate a ratio of a transparent area in which a light emitting element, a circuit element, and a wiring, may not be present on the entire transparent substrate.

Referring to FIG. 7, a single micro-pixel package 100 may drive a plurality of pixels. For example, a single micro-pixel package 100 may include a micro-pixel IC 130 for driving a plurality of pixels and three inorganic light emitting elements 120 constituting a single pixel of a plurality of pixels driven by the micro-pixel IC 130.

The micro-pixel IC 130 included in the micro-pixel package 100 may include pixel circuits 131 configured to drive not only the inorganic light emitting elements 120 included in the same micro-pixel package 100, but also inorganic light emitting elements 120 of other pixels disposed adjacent thereto.

For example, the pixel circuits 131 for driving a plurality of pixels may be integrated into one micro-pixel package 100, and the micro-pixel package 100 may be positioned only in a single pixel area such that an area covered by the micro-pixel IC 130 may be advantageously reduced and the transmittance may be increased.

Figure 8:
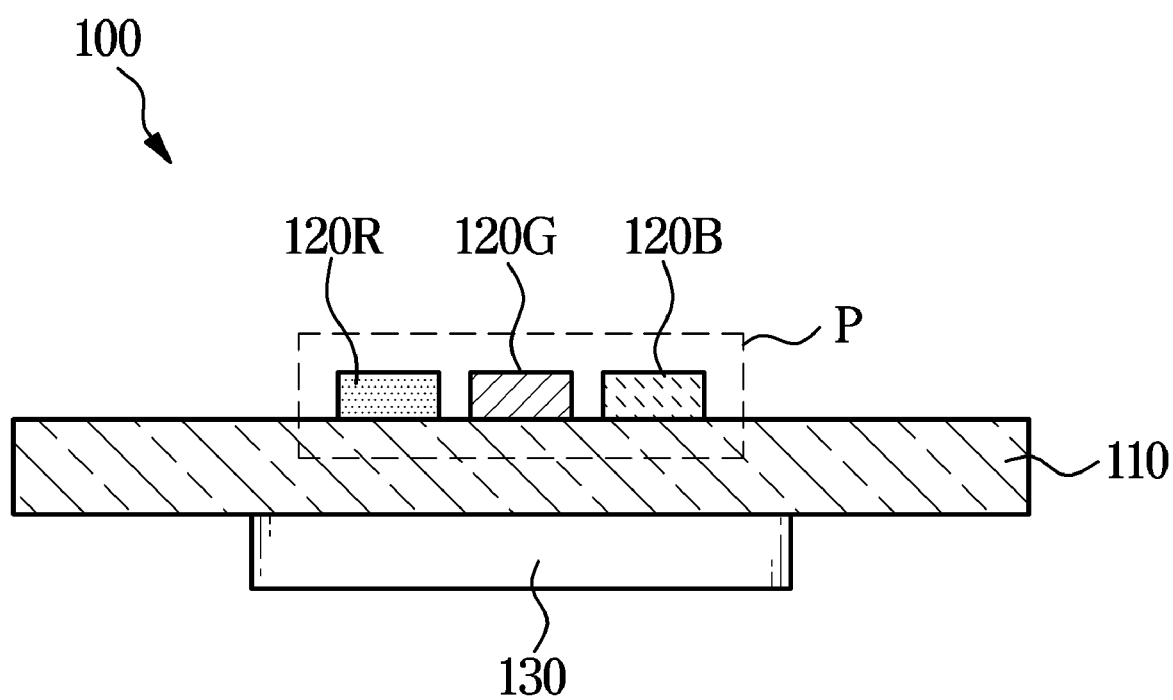
Figure 9:
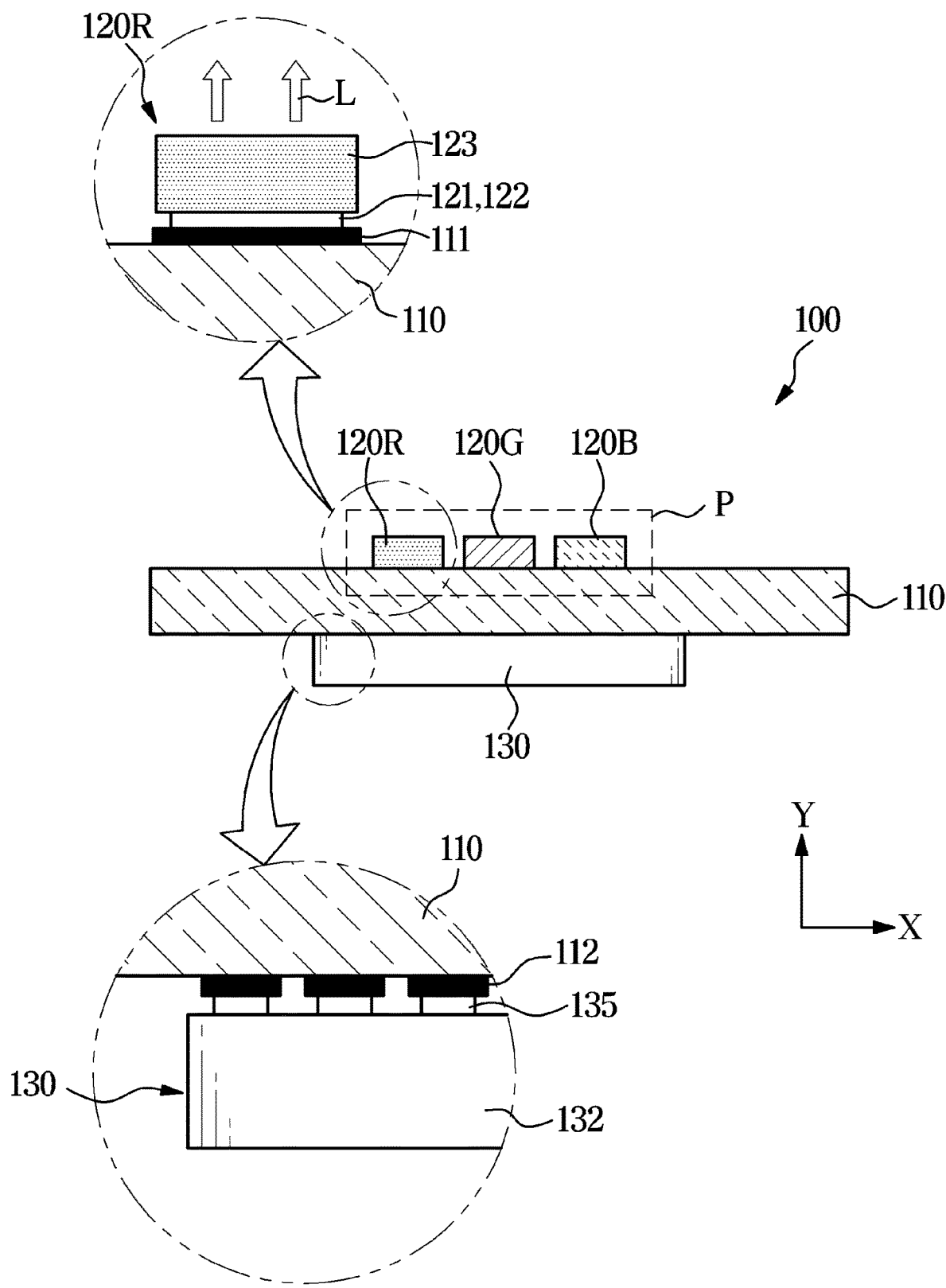

FIGS. 8 to 10 are diagrams illustrating an example applicable to a structure of a single micro-pixel package in a display module, according to one or more embodiments.

Referring to FIG. 8, a plurality of inorganic light emitting elements 120R, 120G, and 120B may be disposed on an upper surface of the relay substrate 110, and the micro-pixel IC 130 controlling the plurality of inorganic light emitting elements 120R, 120G, and 120B may be disposed on a lower surface of the relay substrate 110.

In one or more embodiments, when a component is referred to as being disposed on an upper or lower surface of another component, the component may be directly disposed on the upper or lower surface of another component or another layer, or another component may be disposed between the components.

The plurality of inorganic light emitting elements 120R, 120G, and 120B may be electrically connected to the upper surface of the relay substrate 110, and the micro-pixel IC 130 may be electrically connected to the lower surface of the relay substrate 110.

The relay substrate 110 may be formed of various materials, such as a polyimide (PI) substrate, a silicon substrate, a glass substrate, a plastic substrate, a printed circuit board (PCB), a flexible printed circuit board (FPCB), a cavity substrate, or any other suitable material known to one of ordinary skill in the art.

In FIG. 9, a red inorganic light emitting element 120R among the plurality of inorganic light emitting elements 120R, 120G, and 120B constituting a single pixel P is enlarged as an example, and a part of the micro-pixel IC 130 is enlarged. For the sake of convenience of description, only the red inorganic light emitting element 120R is enlarged, but the other inorganic light emitting elements 120G and 120B may also be electrically connected to the relay substrate 110 in the same manner.

Referring to FIG. 9, in one or more embodiments, the inorganic light-emitting element 120 may have a flip chip structure in which a pair of electrodes 121 and 122 is disposed on a surface opposite to a light-emitting surface of the diode 123.

The pair of electrodes 121 and 122 may include an anode 121 and a cathode 122. As an example, the anode 121 and the cathode 122 may be provided at both ends of the inorganic light-emitting element 120 in a length direction (longitudinal direction). FIG. 9 is a diagram illustrating the inorganic light emitting element 120 viewed from a short side, in which only one electrode out of the pair of electrodes 121 and 122 is observable. The electrode observable in FIG. 9 may be an anode 121 or a cathode 122 and another electrode disposed on the other side and not observable in FIG. 9 may be a cathode 122 or an anode 121.

Referring to FIG. 9, the inorganic light-emitting element 120 may be disposed such that the light-emitting surface faces upward (+Y direction), and the electrode 121 or 122 provided on the opposite surface of the light-emitting surface may be electrically connected to an upper electrode pad 111 provided on the upper surface of the relay substrate 110.

In one or more embodiments, when it is described that two components are electrically connected, this configuration may include not only a case in which conductive materials through which electricity flows are directly soldered between the two components, but also a case in which the two components are connected through separate wires or a case in which a conductive adhesive is used between the two components. There is no restriction on a specific connection method as long as current flows between two connected components.

For example, when the soldering is performed on the two components, gold-indium (Au—In) bonding, gold-tin (Au—Sn) bonding, copper (Cu) pillar/tin-silver (SnAg) bump bonding, and nickel (Ni) pillar/SnAg bump bonding, solder ball bonding using tin-silver-copper (SnAgCu), tin-bismuth (SnBi), SnAg, or any other suitable material known to one of ordinary skill in the art may be used.

Furthermore, when the conductive adhesive is used, a conductive adhesive, such as an anisotropic conductive film (ACF) and an anisotropic conductive paste (ACP), may be disposed between the two components, and pressure may be applied to allow current to flow in a direction in which the pressure is applied.

The pixel circuit 131 for switching and driving the inorganic light-emitting element 120 may be mounted on an IC substrate 132 of the micro-pixel IC 130.

The IC substrate 132 may be provided with a connection pin 135 for electrical connection with the relay substrate 110, and the connection pin 135 may be electrically connected to a lower electrode pad 112 provided on a lower surface of the relay substrate 110.

Since the micro-pixel IC 130 may be disposed on the lower surface of the relay substrate 110, for example, opposite to the surface on which the inorganic light emitting elements 120 are disposed, loss of viewing angle caused when the micro-pixel IC 130 covers a side surface of the inorganic light emitting element 120 may be prevented.

As described above, a single micro-pixel IC 130 may control a single subpixel, for example, a single inorganic light emitting element 120. In this case, as shown in FIG. 10, a single inorganic light emitting element 120 may be mounted on an upper surface of a single relay substrate 110, and a single micro-pixel IC 130 may be mounted on a lower surface of the single relay substrate 110. Here, the relay substrate 110 may be shared between the plurality of inorganic light emitting elements 120 and the plurality of micro-pixel ICs 130.

Figure 11:
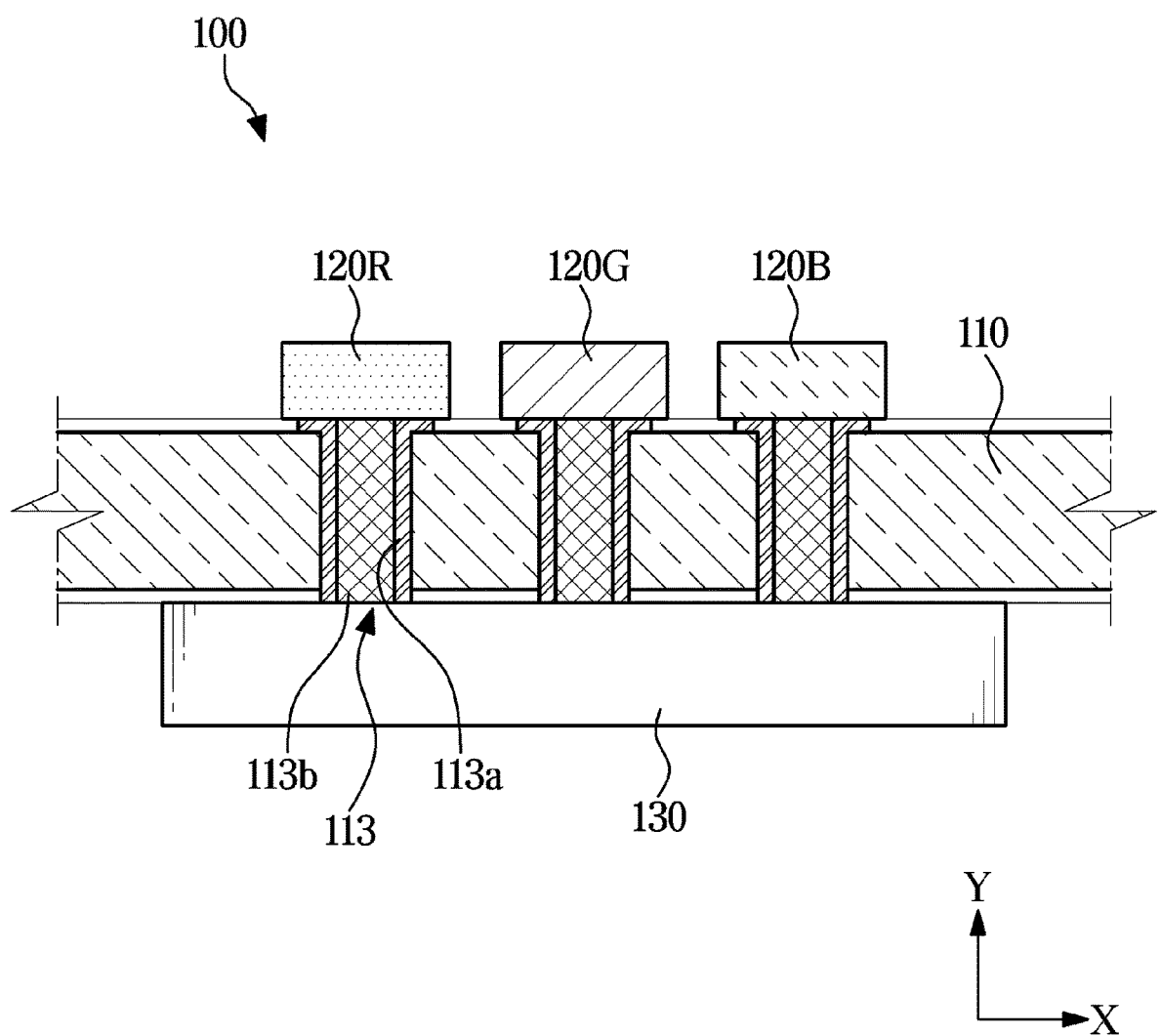
FIGS. 11 and 12 are diagrams showing a method in which an inorganic light emitting element and a micro-pixel IC are connected to each other, in a display module according to an exemplary embodiment.
Figure 12:
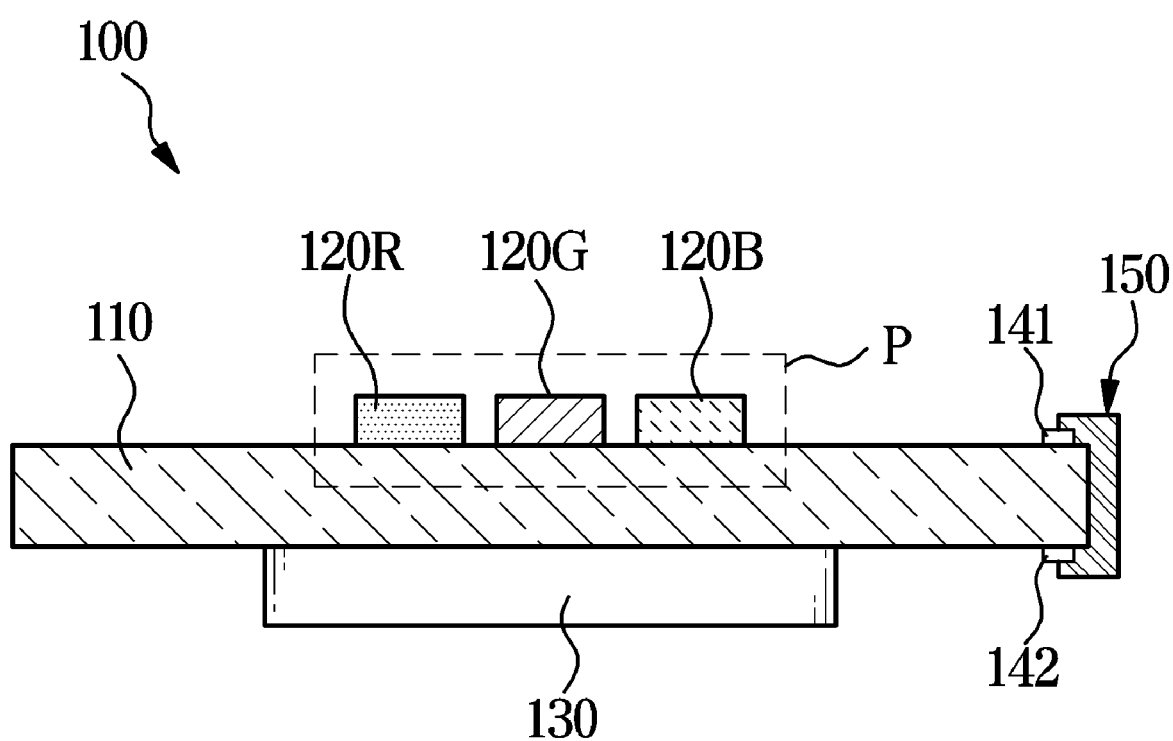

FIGS. 11 and 12 are diagrams showing a configuration in which an inorganic light emitting element and a micro-pixel IC are connected to each other in a display module, according to one or more embodiments.

Referring to FIG. 11, as an example of electrically connecting the plurality of inorganic light emitting elements 120R, 120G, and 120B, which are disposed on the upper surface of the relay substrate 110, to the micro-pixel IC 130, which is disposed on the lower surface of the relay substrate 110, a connection method through a vertical interconnect access hole (VIA hole) may be employed.

When the relay substrate 110 is a glass substrate, VIA holes may be formed in the relay substrate 110 using a through-glass via (TGV) technique, and a VIA filling process of plating inner walls of the formed VIA holes with a conductive material 113a, such as copper, and filling the VIA holes with a filling material 113b is performed to form at least one VIA 113 for electrically connecting the plurality of inorganic light emitting elements 120R, 120G, and 120B disposed on the upper surface of the relay substrate 110 to the micro-pixel IC 130 disposed on the lower surface of the relay substrate 110.

The filling material 113b filled in the VIA holes may be a conductive or non-conductive material.

As another example, as shown in FIG. 12, a side wiring 150 may be formed on one side of the relay substrate 110 to connect an upper wiring and a lower wiring of the relay substrate 110.

On an edge area of the upper surface of the relay substrate 110, a plurality of upper connection pads 141 may be provided, and on an edge area of the lower surface of the relay substrate 110, a plurality of lower connection pads 142 may be provided.

The side wiring 150 may be formed in a shape covering at least one portion of the upper connection pad 141, a side surface of the relay substrate 110, and at least one portion of the lower connection pad 142 to electrically connect the upper connection pad 141 to the lower connection pad 142.

Although not illustrated in the drawings, the upper wiring extending from each of the pixels P may be electrically connected to the side wiring 150 through the upper connection pad 141, and the lower wiring extending from the micropixel IC 130 may be electrically connected to the side wiring 150 through the lower connection pad 142.

For example, the plurality of inorganic light emitting elements 120 disposed on the upper surface of the relay substrate 110 may be electrically connected to the micropixel IC 130 disposed on the lower surface of the relay substrate 110 through the upper wiring, the upper connection pad 141, the side wiring 150, the lower connection pad 142, and the lower wiring.

Specifically, the anode 121 of the inorganic light emitting element 120 may receive a driving current $I_D$ from the micro-pixel IC 130 through the side wiring 150, and the cathode 122 of the inorganic light emitting element 120 may receive a reference voltage $V_{SS}$ from an FPCB configured to supply power through the side wiring 150.

The side wiring 150 may be formed in a method of coating a conductive material on the side surface of the relay substrate 110, and the method of coating the conductive material may include one of an inkjet method, a stamping method, a screen-printing method, a metal deposition method, a bonding method using a tape, and an etching method.

Figure 13:
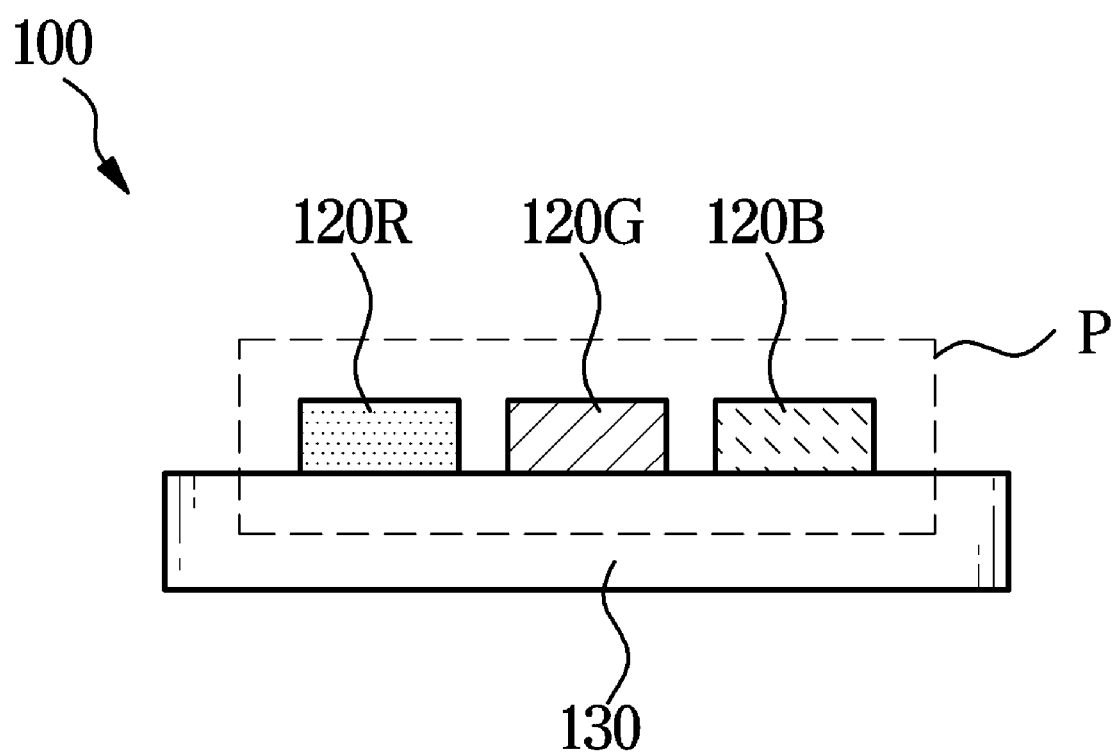
Figure 15:
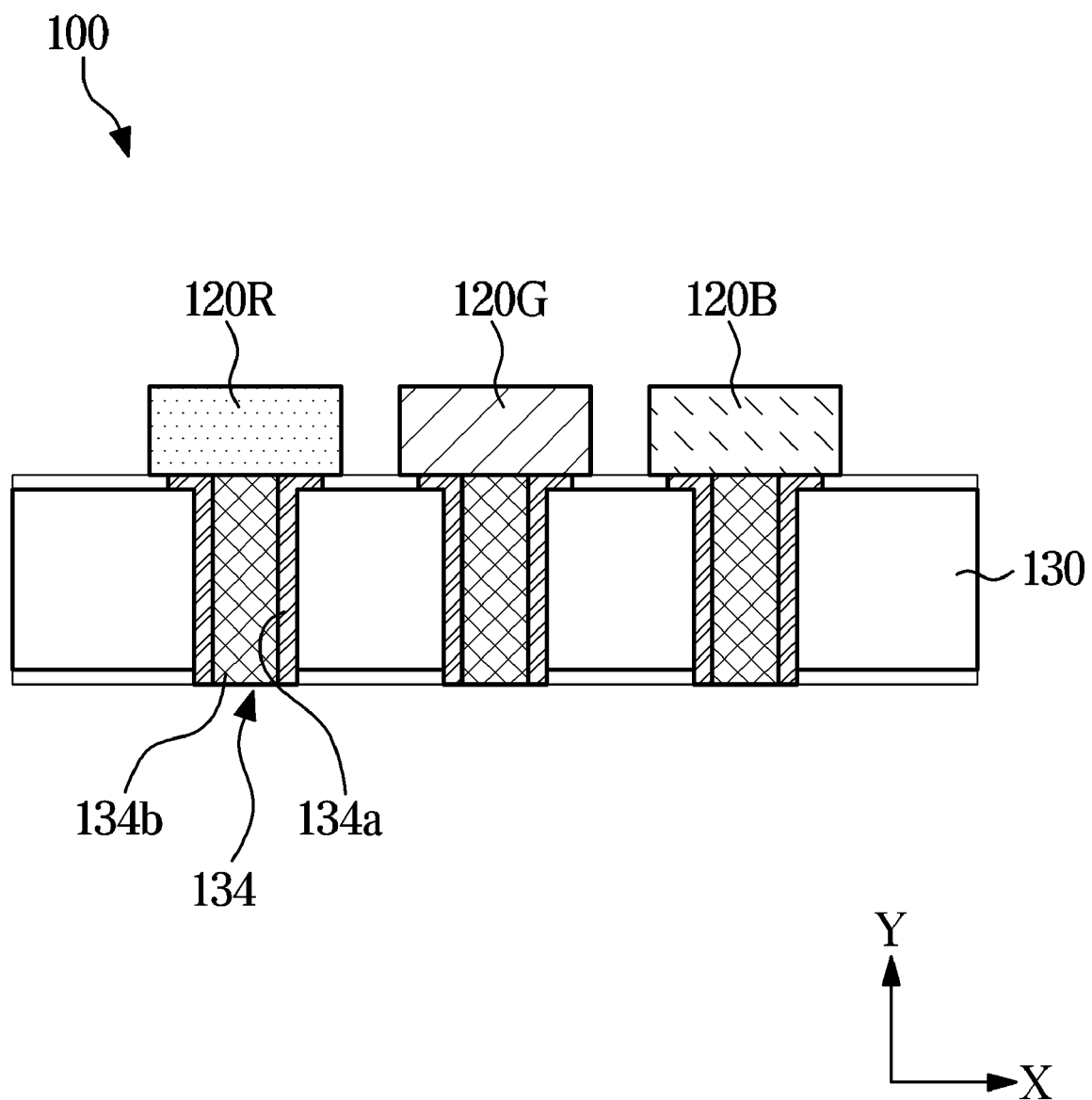

FIGS. 13 to 15 are diagrams illustrating a case in which a plurality of inorganic light emitting elements are directly mounted on a micro-pixel IC, in a display module, according to one or more embodiments.

In the above described example, the micro-pixel IC 130 included in the micro-pixel package 100 may be electrically connected to the plurality of inorganic light emitting elements 120R, 120G, and 120B driven by the micro-pixel IC 130 through the relay substrate 110.

According to one or more examples, as shown in FIG. 13, the plurality of inorganic light emitting elements 120R, 120G, and 120B may be directly mounted on the micro-pixel IC 130. For example, when a single micro-pixel IC 130 controls a single pixel, a red inorganic light emitting element 120R, a green inorganic light emitting element 120G, and a blue inorganic light emitting element 120B may be directly mounted on the micro-pixel IC 130 as shown in FIG. 13.

When a single micro-pixel IC 130 controls a single sub-pixel, the single inorganic light emitting element 120 may be mounted on the single micro-pixel IC 130 as shown in FIG. 14. For example, each of the red inorganic light emitting element 120R, the green inorganic light emitting element 120G, and the blue inorganic light emitting element 120B may be mounted on a micro-pixel IC 130 corresponding thereto.

Even when the inorganic light emitting element 120 is directly mounted on the micro-pixel IC 130, a via hole or side wiring may be formed to transmit driving signals, control signals, power, or any other suitable signal to the plurality of inorganic light emitting elements 120R, 120G, and 120B.

Referring to the example of FIG. 15, VIA holes are formed in the substrate of the micro-pixel IC 110, and a VIA filling process of plating inner walls of the formed VIA holes with a conductive material 134a, such as copper, and filling the VIA holes with a filling material 134b may be performed to form at least one VIA 113 for electrically connecting the plurality of inorganic light emitting elements 120R, 120G, and 120B to the pixel circuit 131.

Figure 16:
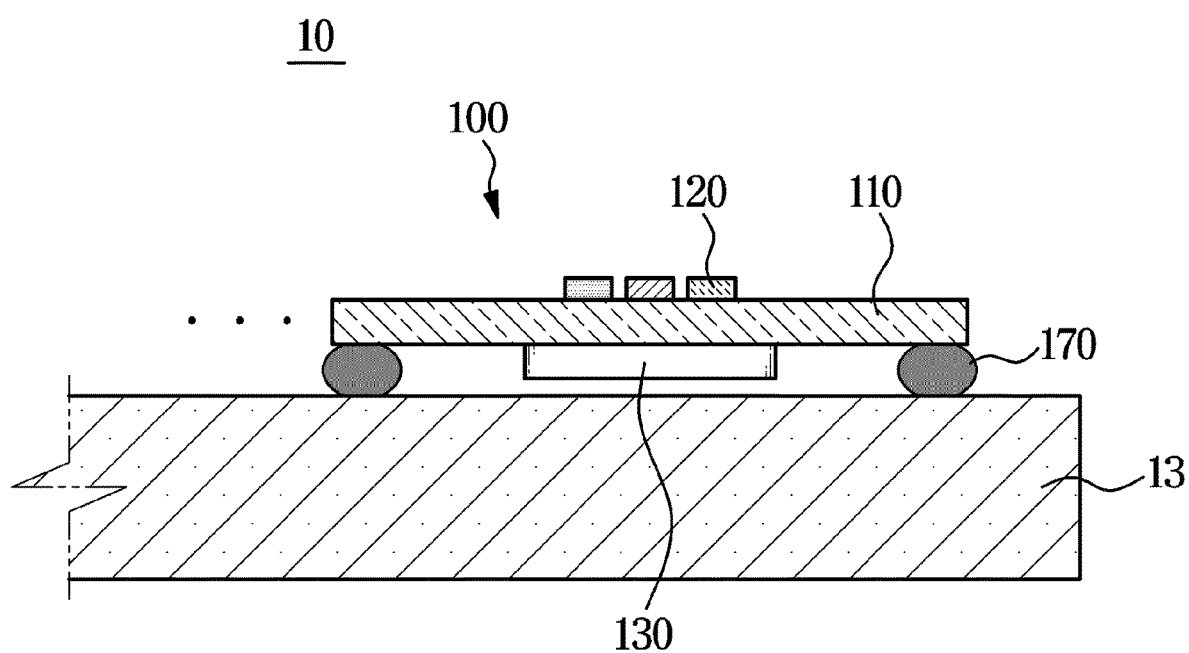
FIGS. 16 and 17 are diagrams illustrating a side section of a transparent substrate on which a micro-pixel package is disposed, in a display module according to one or more embodiments.
Figure 17:
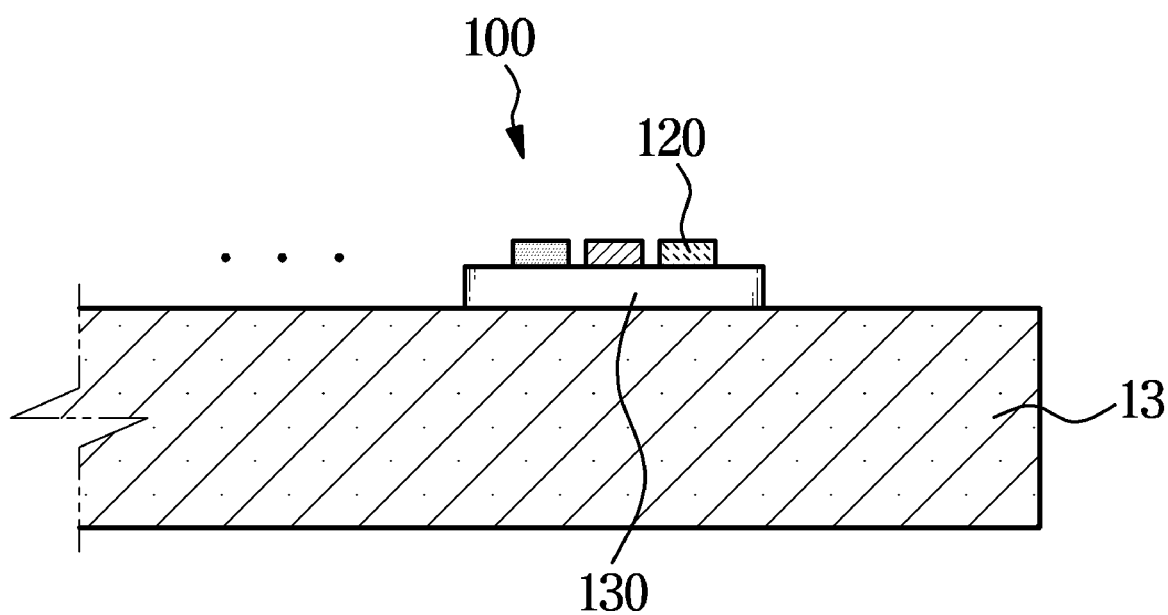

FIGS. 16 and 17 are diagrams illustrating a side section of a transparent substrate on which a micro-pixel package may be disposed in a display module, according to one or more embodiments.

Referring to FIGS. 16 and 17, the above described micro-pixel package 100 may be disposed on the upper surface of the transparent substrate 13. The transparent substrate 13 may be implemented as one of substrates formed of various materials, such as a silicon substrate, a glass substrate, a plastic substrate, a PCB, an FPCB, a cavity substrate, or any other suitable substrate material known to one of ordinary skill in the art. There is no restriction on the material of the transparent substrate 13 as long substrate is configured to be transparent.

As shown in FIG. 16, when the relay substrate 110 is included in the micro-pixel package 100 of display module 10, the micro-pixel package 100 may be disposed such that the lower surface of the relay substrate 110 may the transparent substrate 13 and the upper surface of the relay substrate 110, on which the plurality of inorganic light emitting elements 120R, 120G, and 120B are disposed, may face upward (+Y direction).

For example, the micro-pixel package 100 may be electrically connected to a transparent substrate 13 by a ball grid array (BGA) soldering method using solder balls. To this end, at least one solder ball 170 may be used for each of the micro-pixel packages 100.

The height or diameter of the solder ball 170 may be determined based on the height or thickness of the micro-pixel IC 130 mounted on the lower side of the micro-pixel package 100. Specifically, the height of the solder ball 170 may be provided to be greater than the height of the micro-pixel IC 130, to prevent the micro-pixel IC 130 from being damaged by being in contact with the transparent substrate 13 or prevent the micro-pixel package 100 and the transparent substrate 13 from failing to be normally connected to each other.

As shown in FIG. 17, when the plurality of inorganic light emitting elements 120R, 120G, and 120B are directly mounted on the upper surface of the micro-pixel IC 130, the micro-pixel package 100 may be disposed such that the upper surface of the micro-pixel IC 130 faces upward (+Y direction).

Figure 18:
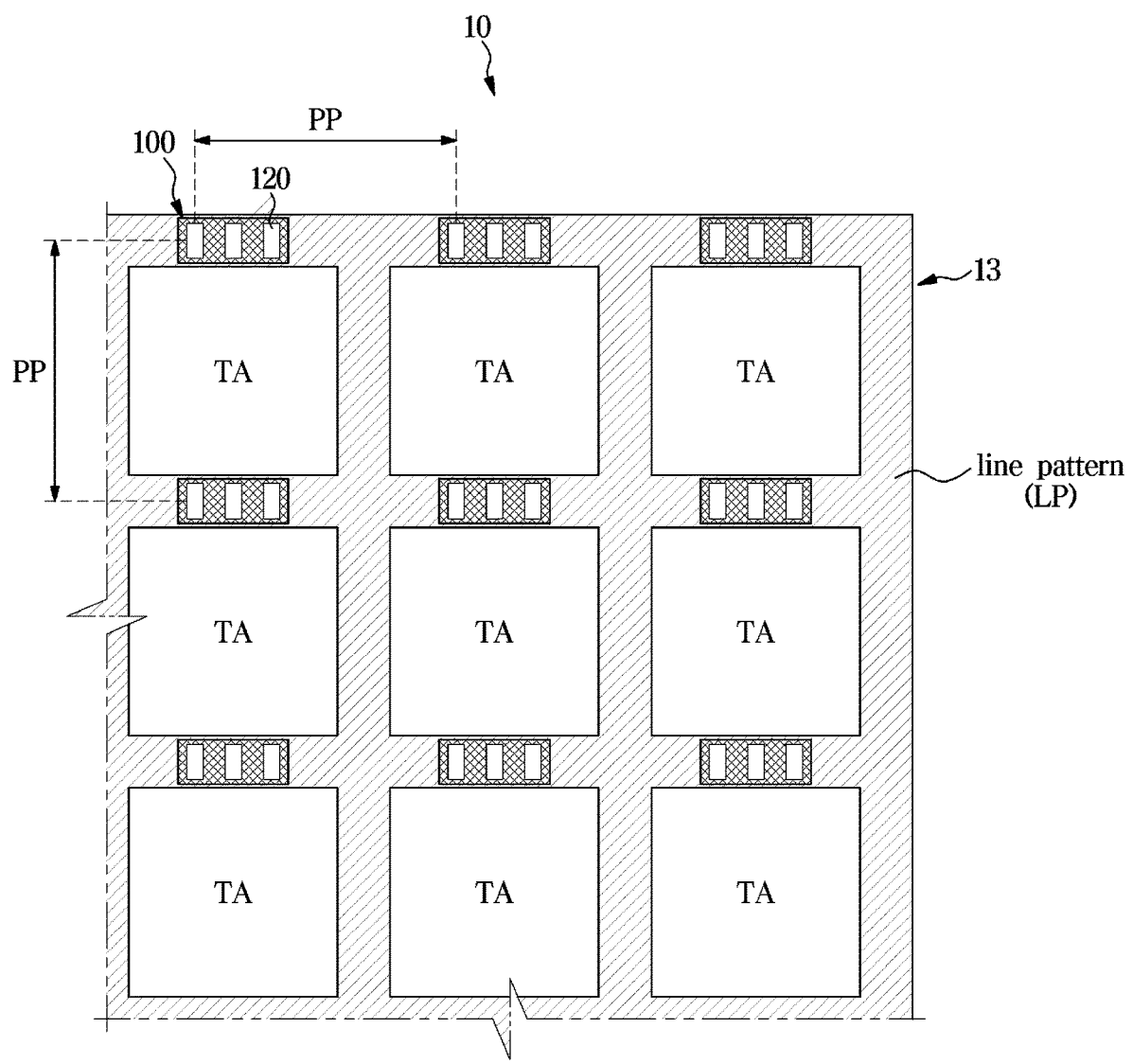
FIG. 18 is a top view illustrating a transparent substrate on which micro-pixel packages are disposed, in a display module according to an exemplary embodiment.

FIG. 18 is a top view illustrating a transparent substrate on which micro-pixel package may be disposed in a display module, according to one or more embodiments.

Referring to FIG. 18, a line pattern LP for supplying control signals, power, and the like may be formed on the transparent substrate 13 of the display module 10 according to one or more embodiments. In order to secure a high aperture ratio, the line pattern LP may be provided in a form of a two-dimensional grid.

The micro-pixel package 100 may be disposed on the line pattern LP. The inorganic light emitting elements 120 provided on the micro-pixel package 100 may be arranged to maintain a constant pixel pitch PP.

The micro-pixel IC 130 and the plurality of inorganic light emitting elements 120 may be stacked in the vertical direction in the micro-pixel package 100 while the micro-pixel package 100 may be disposed on the line pattern LP so that all areas of the transparent substrate 13 except for the line pattern LP may form transparent areas TA. For example, assuming that the size of a single pixel area is 600 μm, the width of the line pattern LP may be limited to about 30 μm to 50 μm so that the ratio of the transparent area TA may be maximized.

Since the line pattern LP is provided in the form of a two-dimensional grid and all areas except for the line pattern LP form transparent areas TA, the plurality of transparent areas TA are arranged two-dimensionally on the transparent substrate 13 of the display module 10, according to one or more embodiments.

In the example of FIG. 18, the micro-pixel package 100 may be provided for each pixel. For example, a plurality of inorganic light emitting elements 120 constituting each pixel may receive a driving current $I_D$ from a pixel circuit 131 mounted together in the micro-pixel package 100.

The plurality of inorganic light emitting elements 120 may receive power from the line pattern LP, and the micro-pixel IC 130 may receive power and control signals from the line pattern.

The control signal supplied from the line pattern may include a gate signal and a data signal.

Figure 19:
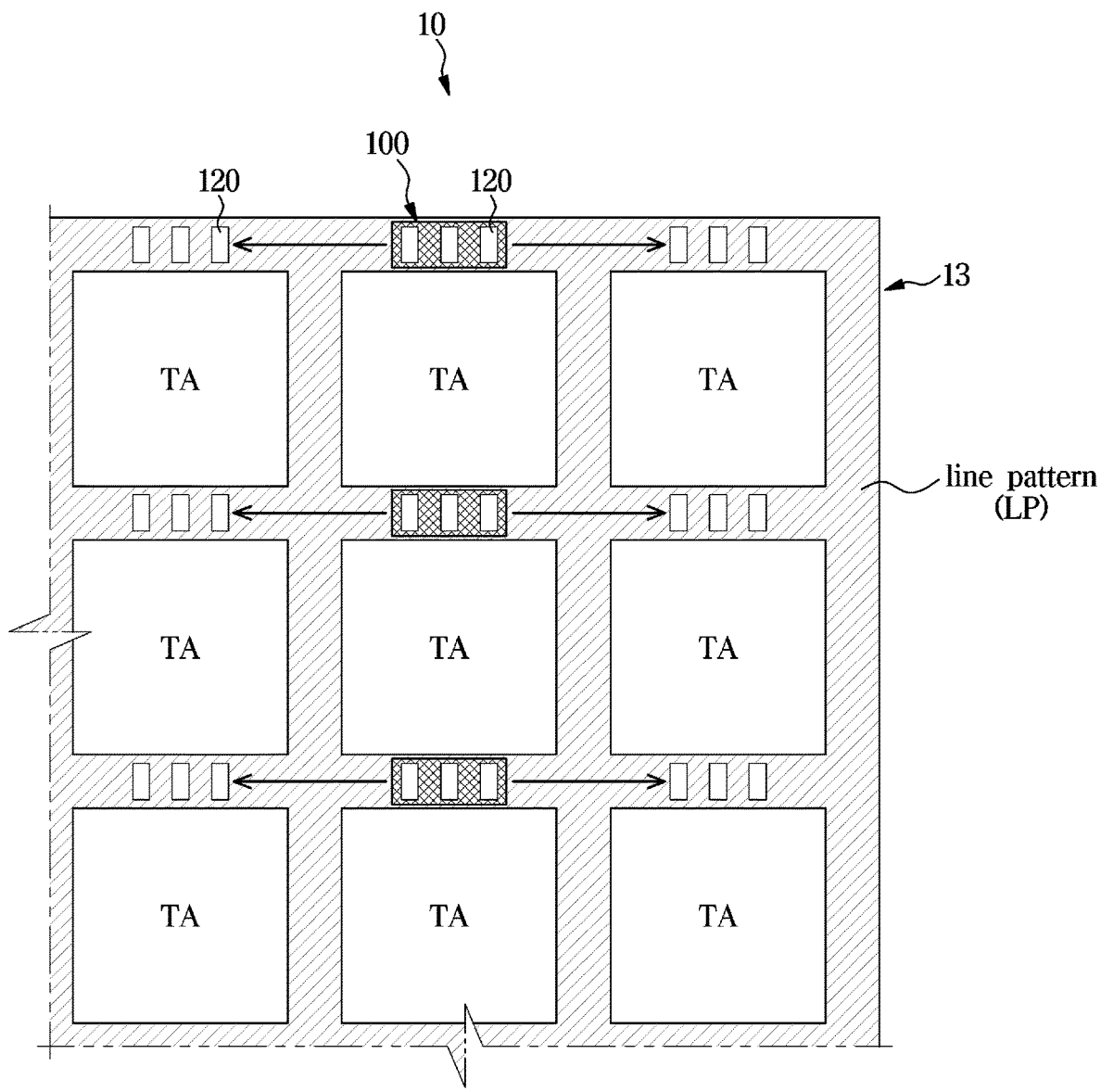
FIG. 19 is a diagram illustrating another example of a micro-pixel package disposed on a transparent substrate, in a display module according to one or more embodiments.
Figure 20:
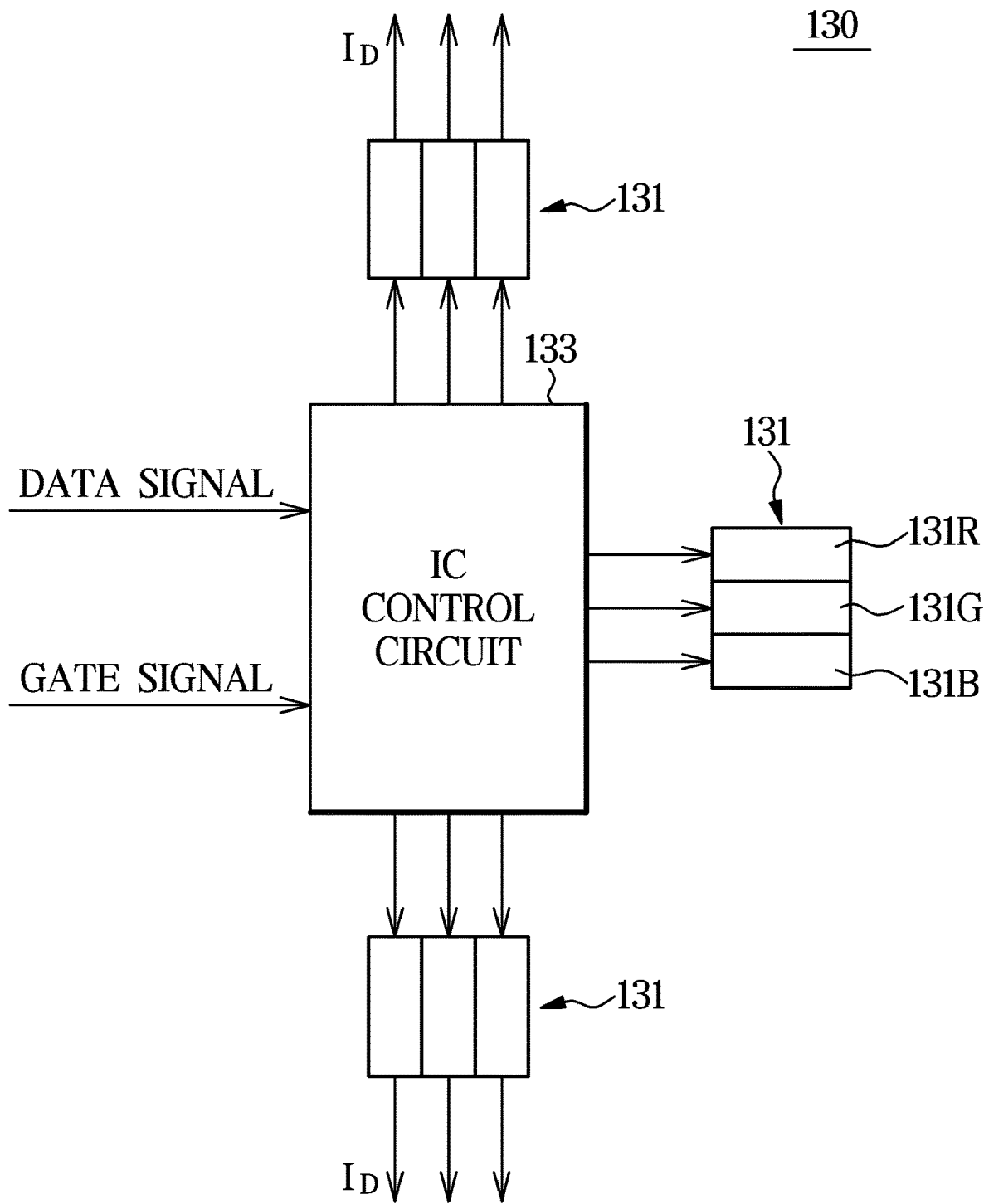
FIG. 20 is a diagram illustrating a circuit configuration of a micro-pixel IC when a micro-pixel package is disposed as shown in the example of FIG. 19, in a display module according to one or more embodiments.

FIG. 19 is a diagram illustrating an example of a micro-pixel package disposed on a transparent substrate in a display module, according to one or more embodiments, and FIG. 20 is a diagram illustrating a circuit configuration of a micro-pixel IC when a micro-pixel package is disposed, as shown in the example of FIG. 19, in a display module, according to one or more embodiments.

Referring to FIG. 19, a single micro-pixel package 100 may also control other pixels adjacent thereto. For example, a single micro-pixel package 100 may supply a driving current $I_D$ to a plurality of inorganic light emitting elements 120 disposed in other pixels located adjacent to the single micro-pixel package 100 in the left and right side directions.

In this case, as shown in FIG. 20, the micro-pixel package 100 may be provided with pixel circuits 131 for driving three pixels. When a single pixel includes a red subpixel, a green subpixel, and a blue subpixel, a corresponding red pixel circuit 131R, a green pixel circuit 131G, and a blue pixel circuit 131B may be provided to drive the single pixel. The micro-pixel IC 130 may be provided with an IC control circuit 133 that appropriately distributes various signals input to the micro-pixel IC 130 to the plurality of pixel circuits 131.

The IC control circuit 133 may distribute a data signal and a gate signal transmitted from the driver IC 200 to a plurality of pixel circuits 131P for driving control target pixels. Accordingly, based on this configuration, the number of wires required for the display panel 11 to be connected to the driver IC 200 or the timing controller 500 may be advantageously reduced.

Furthermore, a gate signal for turning on/off a pixel may also be generated in the micro-pixel IC 130. In this case, the volume and load of the driver IC 200 may be reduced, a current-resistance (IR) drop occurring in the process of transmitting the gate signal may be resolved, and the complexity of wiring may also be reduced. The gate signal may also be generated by the IC control circuit 133, or a separate gate signal generation circuit may be provided in the micro-pixel IC 130.

The inorganic light emitting elements 120 provided in the micro-pixel package 100 together with the pixel circuits 131 may receive a driving current through the via hole or side wiring described above.

Left and right pixels that are not provided on the micro-pixel package 100 and are mounted on the wiring pattern LP may receive driving currents output from the micro-pixel package 100 through the line pattern LP.

Figure 21:
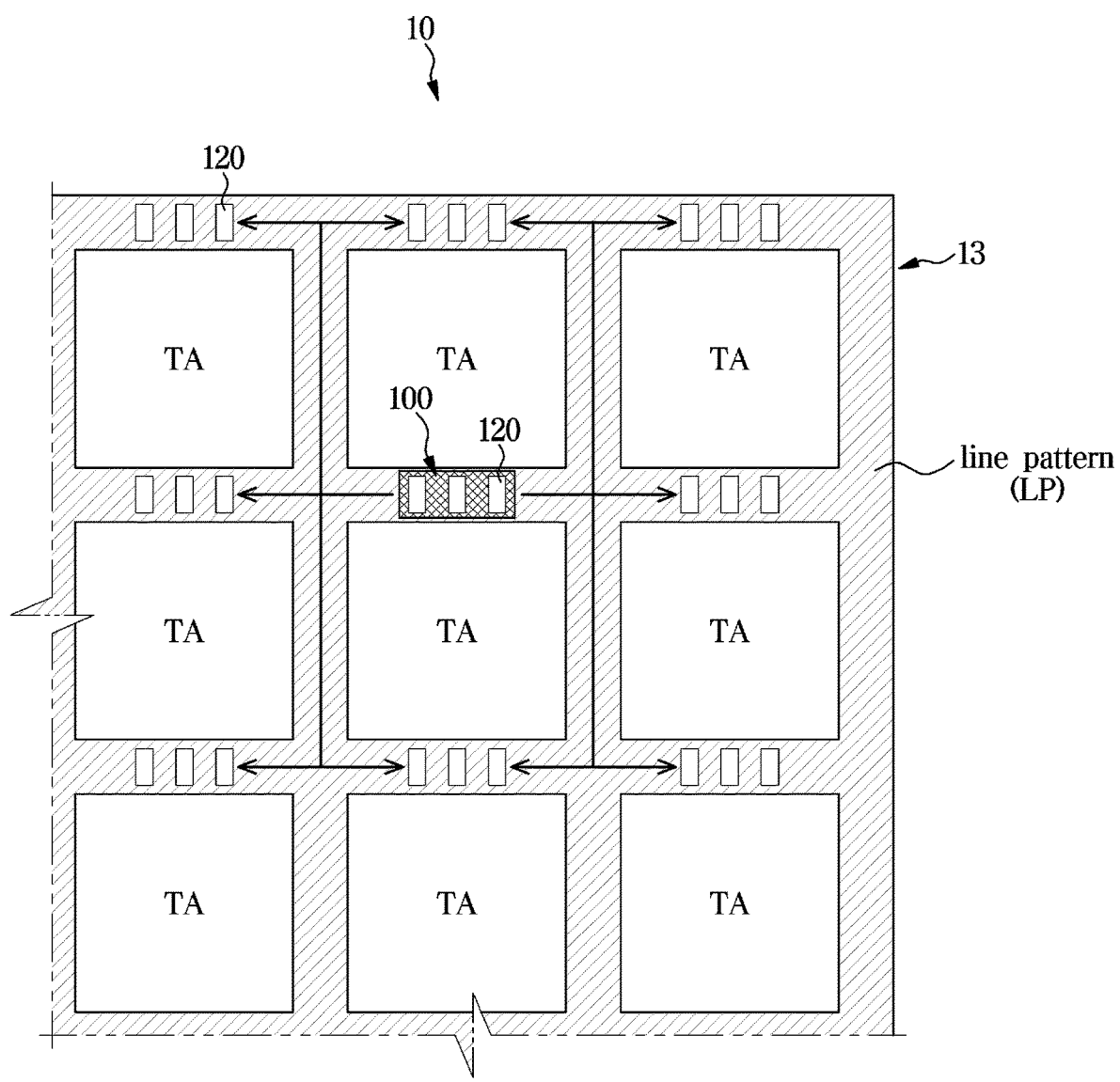
FIG. 21 is a diagram illustrating still another example of a micro-pixel package disposed on a transparent substrate, in a display module according to one or more embodiments.
Figure 22:
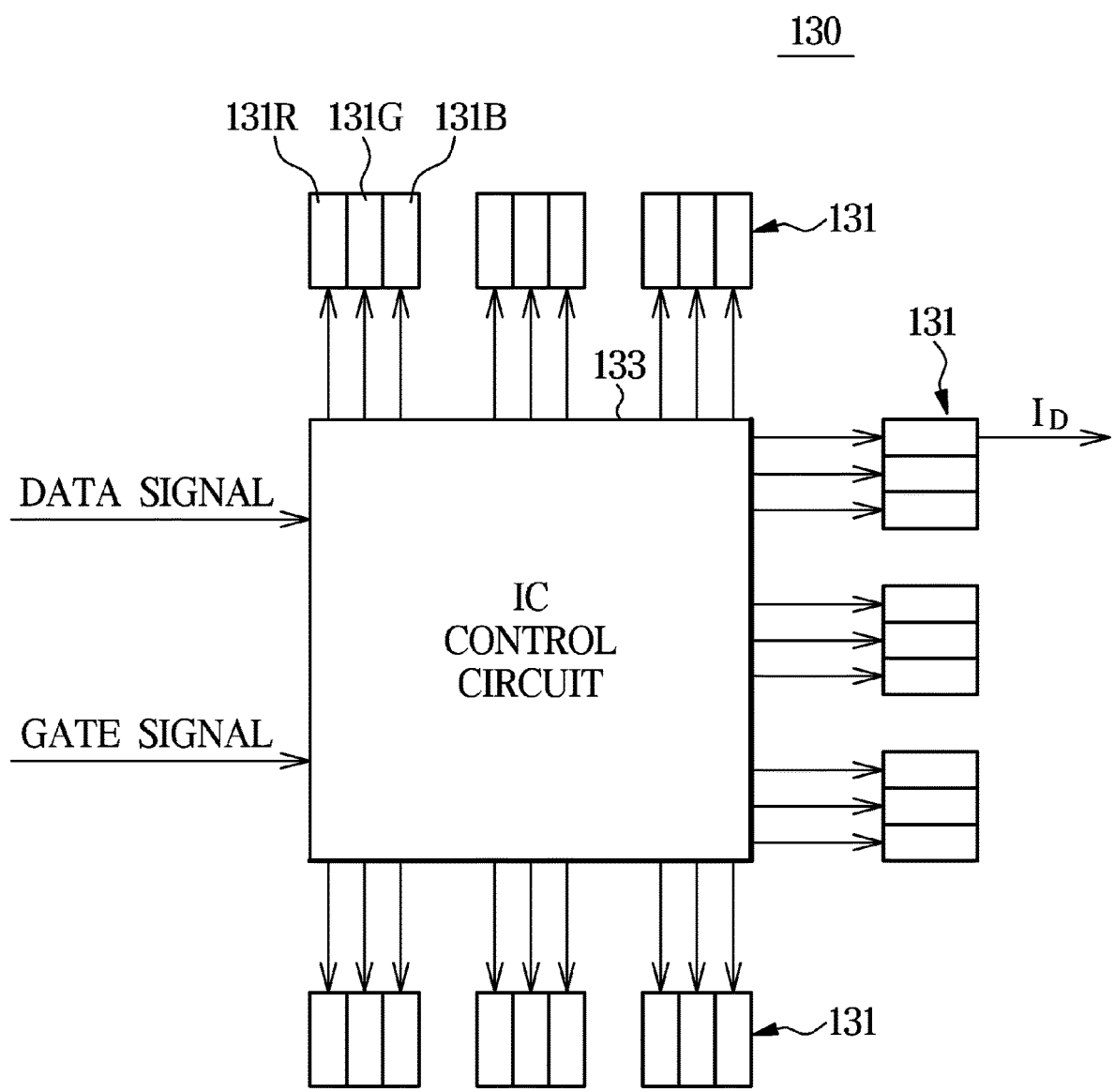
FIG. 22 is a diagram illustrating a circuit configuration of a micro-pixel IC when a micro-pixel package is disposed as shown in the example of FIG. 21, in a display module according to one or more embodiments.

FIG. 21 is a diagram illustrating still another example of a micro-pixel package disposed on a transparent substrate, in a display module according to one or more embodiments, and FIG. 22 is a diagram illustrating a circuit configuration of a micro-pixel IC when a micro-pixel package is disposed as shown in the example of FIG. 21, in a display module according to one or more embodiments.

Referring to the example of FIG. 21, a single micro-pixel package 100 may supply driving currents $I_D$ to a plurality of inorganic light emitting elements 120 disposed in other pixels adjacent to the single micro-pixel package 100 in upper and lower side direction, left and right side directions, and/or diagonal directions.

In this case, as shown in FIG. 22, the micro-pixel package 100 may be provided with pixel circuits 131 for driving nine pixels. When a single pixel includes a red subpixel, a green subpixel, and a blue subpixel, a corresponding red pixel circuit 131R, a green pixel circuit 131G, and a blue pixel circuit 131B may be provided to drive the single pixel.

The inorganic light emitting elements 120 provided in the micro-pixel package 100 together with the pixel circuits 131 may receive a driving current through the above described via hole or side wiring.

Pixels that are not provided on the micro-pixel package 100 and are mounted on the wiring pattern LP, while being positioned adjacent to the micro-pixel package 100 in the upper and lower side directions/left and right side directions/diagonal directions, may receive driving currents output from the micro-pixel package 100 through the line pattern LP.

Figure 23:
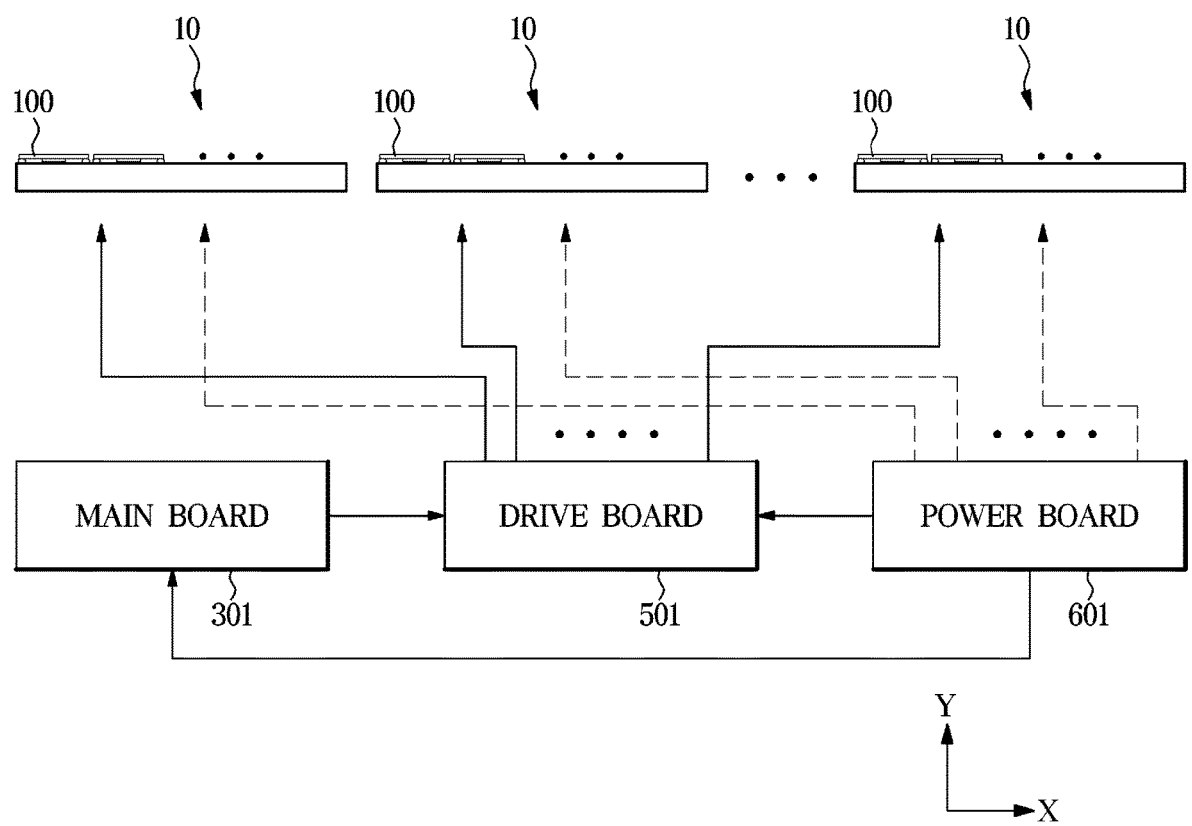
FIG. 23 is a diagram illustrating a display apparatus implemented by a plurality of display modules.

FIG. 23 is a diagram illustrating a display apparatus implemented by a plurality of display modules.

A plurality of the display modules 10, according to the above-described one or more embodiments, may be combined to implement a display apparatus 1.

As described above, each of the plurality of display modules 10 may include a driver IC 200 for driving the display panel 11. The driver IC 200 may be electrically connected to the display panel 11 using one of various bonding methods, such as chip on film (COF), film on glass (FOG) bonding, chip on glass (COG) bonding, tape automated bonding (TAB), or any other suitable bonding method known to one of ordinary skill in the art.

For example, the display panel 11 may be connected to an FPCB through a film, on which the driver IC 200 is mounted. The FPCB may be connected to a drive board 501 to electrically connect the display module 10 to the drive board 501.

The timing controller 500 may be provided on the drive board 501. Accordingly, the drive board 501 may be referred to as a T-con board. The plurality of display modules 10 may receive image data, timing control signals, or any other suitable data signal from the drive board 501.

Furthermore, the display apparatus 1 may further include a main board 301 and a power board 601. A main controller 300 may be provided on the main board 301, and a power circuit required to supply power to the plurality of display modules 10 may be provided on the power board 601.

The power board 601 may be electrically connected to the plurality of display modules 10-1, 10-2, . . . , and 10-n through the FPCB, and may supply a power voltage $V_{DD}$, a reference voltage $V_{SS}$, and various operating power sources to the plurality of display modules 10 connected through the FPCB.

In the above examples, the plurality of display modules 10 are illustrated as sharing the drive board 501, but a separate drive board 501 may be connected to each of the display modules 10. In one or more examples, a plurality of display modules 10 may be grouped and a single drive board 501 may be connected to each group.

The transparent display module 10, according to one or more embodiments, does not require a backlight unit, a liquid crystal layer, or an encapsulation layer, and instead, includes a ultra-small micro LED and a driving circuit and wires for driving the same and thus, is beneficial in securing the aperture ratio, which is an important factor in implementing a transparent display apparatus.

Furthermore, since the micro-pixel IC 130 and the plurality of inorganic light emitting elements 120 are stacked in the vertical direction, the area occupied by the micro-pixel IC 130 and the plurality of inorganic light emitting elements 120 on the transparent substrate 13 is advantageously reduced and the aperture ratio of the transparent substrate 13 is increased.

A transparent display module 10, according to one or more embodiments, may include a transparent substrate 13; a line pattern LP provided on the transparent substrate 13 in a form of a two-dimensional grid; a plurality of micro-pixel integrated circuits (ICs) 130 provided on the line pattern LP; a plurality of inorganic light emitting elements 120 provided on the line pattern LP or the plurality of micro-pixel ICs; and a plurality of transparent areas TA formed in areas in which the line pattern LP in the form of the two-dimensional grid is not provided.

The transparent display module 10, according to one or more embodiments, does not require a backlight unit, a liquid crystal layer, or an encapsulation layer, and instead, includes a ultra-small micro light emitting diode (LED) and a driving circuit and wires for driving the same and thus, is beneficial in securing the aperture ratio, which is an important factor in implementing a transparent display apparatus.

Furthermore, since the micro-pixel IC 130 and the plurality of inorganic light emitting elements 120 are stacked in the vertical direction, the area occupied by the micro-pixel IC 130 and the plurality of inorganic light emitting elements 120 on the transparent substrate 13 is reduced and the aperture ratio of the transparent substrate 13 is advantageously increased.

The plurality of micro-pixel ICs 130 may include a pixel circuit 131 for supplying a driving current to the plurality of inorganic light emitting elements.

The transparent display module 10 may further include a micro-pixel package 100 provided on the line pattern.

Since the micro-pixel package 100 may include the micro-pixel IC 130 and the plurality of inorganic light emitting elements 120 stacked in the vertical direction in the micro-pixel package 100, while the micro-pixel package 100 is disposed on the line pattern LP, all areas of the transparent substrate 13, except for the line pattern LP, may form transparent areas TA.

According to one or more embodiments, the micro-pixel package 100 may include: a relay substrate 110; the plurality of inorganic light emitting elements 120 disposed at an upper side of the relay substrate 110; and a single micro-pixel IC 130 of the plurality of micro-pixel ICs that is disposed at a lower side of the relay substrate 110.

The micro-pixel package 100 may include: a single micro-pixel IC 130 among the plurality of micro-pixel ICs; and the plurality of inorganic light emitting elements 120 mounted on an upper surface of the single micro-pixel IC 130.

The plurality of inorganic light emitting elements 120 constitute a plurality of pixels that are two-dimensionally arranged, in which each of the plurality of pixels may include two or more inorganic light emitting elements among the plurality of inorganic light emitting elements.

The plurality of micro-pixel ICs 130 may correspond to the plurality of pixels, respectively, and the plurality of inorganic light emitting elements 120 may be supplied with the driving current from a micro-pixel IC 130 corresponding to a pixel, among the plurality of pixels, in which the plurality of inorganic light emitting elements 120 are included.

At least one of the plurality of micro-pixel ICs 130 may supply the driving current to two or more pixels among the plurality of pixels.

The number of micro-pixel ICs 130 included in the plurality of micro-pixel ICs 130 may be smaller than a number of pixels included in the plurality of pixels.

The at least one of the plurality of micro-pixel ICs 130 may supply the driving current to at least one pixel adjacent thereto, among the plurality of pixels, through the line pattern.

The line pattern LP may transfer a gate signal and a data signal for image display to the plurality of micro-pixel ICs.

The at least one of the plurality of micro-pixel ICs 130 may further include an IC control circuit 133 configured to distribute the transferred gate signal and data signal to two or more pixel circuits that supply driving currents to the two or more pixels, respectively.

A transparent display apparatus 1 according to one or more embodiments includes: at least one display module 10; and a driver IC 200 configured to generate a driving signal to be supplied to the at least one display module 10.

The at least one display module 10 may include: a transparent substrate 13; a line pattern LP provided on the transparent substrate in a form of a two-dimensional grid; a plurality of micro-pixel integrated circuits (ICs) 130 provided on the line pattern; a plurality of inorganic light emitting elements 120 provided on the line pattern or the plurality of micro-pixel ICs; and a plurality of transparent areas TA formed in areas in which the line pattern in the form of the two-dimensional grid is not provided.

The plurality of micro-pixel ICs 130 may include a pixel circuit 131 for supplying a driving current to the plurality of inorganic light emitting elements.

The transparent display module 10 may further include a micro-pixel package 100 provided on the line pattern.

The micro-pixel package 100 may include: a relay substrate 110; the plurality of inorganic light emitting elements 120 disposed at an upper side of the relay substrate 110; and a single micro-pixel IC 130 of the plurality of micro-pixel ICs that is disposed at a lower side of the relay substrate 110.

The micro-pixel package 100 may include: a single micro-pixel IC 130 among the plurality of micro-pixel ICs; and the plurality of inorganic light emitting elements 120 mounted on an upper surface of the single micro-pixel IC 130.

The plurality of inorganic light emitting elements 120 may constitute a plurality of pixels that are two-dimensionally arranged, in which each of the plurality of pixels includes two or more inorganic light emitting elements among the plurality of inorganic light emitting elements.

The plurality of micro-pixel ICs 130 may correspond to the plurality of pixels, respectively, and the plurality of inorganic light emitting elements 120 may be supplied with the driving current from a micro-pixel IC 130 corresponding to a pixel, among the plurality of pixels, in which the plurality of inorganic light emitting elements are included.

At least one of the plurality of micro-pixel ICs may supply the driving current to two or more pixels among the plurality of pixels.

The number of micro-pixel ICs 130 included in the plurality of micro-pixel ICs 130 may be smaller than a number of pixels included in the plurality of pixels.

At least one of the plurality of micro-pixel ICs 130 may supply the driving current to at least one pixel adjacent thereto among the plurality of pixels through the line pattern.

The line pattern LP may transfer a gate signal and a data signal for image display to the plurality of micro-pixel ICs.

The at least one of the plurality of micro-pixel ICs 130 may further include an IC control circuit 133 configured to distribute the transferred gate signal and data signal to two or more pixel circuits that supply driving currents to the two or more pixels, respectively.

The embodiments disclosed with reference to the accompanying drawings have been described above. It should be appreciated by those skilled in the art to which the present invention pertains that forms different from the disclosed embodiments may be implemented without departing from the technical spirit and essential features of the present invention. The disclosed embodiments are illustrative and should not be construed as limitative.

The invention claimed is:

1. A transparent display module, comprising:
   a transparent substrate;
   a line pattern provided on the transparent substrate in a form of a two-dimensional grid;
   a plurality of micro-pixel packages, each micro-pixel package comprising a relay substrate, at least one micro-pixel integrated circuit (IC) provided on the line pattern and a plurality of inorganic light emitting elements provided on the at least one micro-pixel IC in which:
   the plurality of inorganic light emitting elements are provided on a first surface of the relay substrate and the at least one micro-pixel IC is provided on a second surface of the relay substrate that is opposite to the first surface of the relay substrate, and
   a plurality of transparent areas formed in areas in which the line pattern is not provided,
   wherein the at least one micro-pixel IC includes at least one pixel circuit configured to supply a driving current to the plurality of inorganic light emitting elements,
   wherein the plurality of micro-pixel packages are electrically connected to the transparent substrate by solder balls,
   wherein a height of each of the solder balls is greater than a height of the at least one micro-pixel IC such that the at least one micro-pixel IC is not in contact with the transparent substrate
   wherein the each micro-pixel package comprises:
   an upper wiring provided on the first surface of the relay substrate and extending from the plurality of inorganic light emitting elements;
   a lower wiring provided on the second surface of the relay substrate and extending from the at least one macro-pixel IC:
   an upper connection pad provided on an edge of the first surface of the relay substrate,
   a lower connection pad provided on an edge of the second surface of the relay substrate; and
   wherein the plurality of inorganic light emitting elements provided on the first surface of the relay substrate are electrically connected to the at least one micro-pixel IC provided on the surface of the relay substrate through the upper wiring, the upper connection pad, the side wiring, the lower connection pad, and the lower wiring.

2. The transparent display module of claim 1, wherein the plurality of inorganic light emitting elements constitute a plurality of pixels that are two-dimensionally arranged, wherein each of the plurality of pixels comprises two or more inorganic light emitting elements among the plurality of inorganic light emitting elements.

3. The transparent display module of claim 2, wherein the at least one micro-pixel IC corresponds to the plurality of pixels, respectively, and
the plurality of inorganic light emitting elements are supplied with the driving current from a corresponding micro-pixel IC.

4. The transparent display module of claim 2, wherein the at least one micro-pixel IC supplies the driving current to two or more pixels from the plurality of pixels.

5. The transparent display module of claim 4, wherein a number of micro-pixel ICs in the at least one micro-pixel IC is smaller than a number of pixels in the plurality of pixels.

6. The transparent display module of claim 4, wherein the at least one micro-pixel IC supplies the driving current to at least one pixel adjacent thereto from the plurality of pixels through the line pattern.

7. The transparent display module of claim 6, wherein the line pattern transfers a gate signal and a data signal for image display to the at least one micro-pixel IC.

8. The transparent display module of claim 7, wherein the at least one micro-pixel IC further comprises an IC control circuit configured to distribute the transferred gate signal and data signal to two or more pixel circuits that supply driving currents to the two or more pixels, respectively.

9. The transparent display module according to claim 1,
wherein the plurality of transparent areas are arranged in a two-dimensional grid such that each transparent area is surrounded by the line pattern, and
wherein each row of inorganic light emitting elements from the plurality of inorganic light emitting elements provided on the line pattern alternates with each row of transparent areas from the plurality of transparent areas.

10. The transparent display module according to claim 1, wherein the at least one micro-pixel IC is electrically connected to each inorganic light emitting element through a respective via hole that spans from the second surface of the relay substrate to the first surface of the relay substrate.

11. The transparent display module according to claim 10, wherein inners walls of the respective via hole are plated with a conductive material and the remaining portions of the respective via hole are filled with a filling material.

12. A transparent display apparatus comprising:
at least one display module; and
a driver integrated circuit (IC) configured to generate a driving signal to be supplied to the at least one display module,
wherein the at least one display module comprises:
a transparent substrate,
a line pattern provided on the transparent substrate in a form of a two-dimensional grid,
a plurality of micro-pixel packages, each micro-pixel package comprising a relay substrate, a relay substrate, at least one micro-pixel integrated circuits (IC) provided on the line pattern, and a plurality of inorganic light emitting elements provided on the at least one micro-pixel IC in which:
the plurality of inorganic light emitting elements are provided on a first surface of the relay substrate and the at least one micro-pixel IC is provided on a second surface of the relay substrate that is opposite to the first surface of the relay substrate, and
a plurality of transparent areas formed in areas in which the line pattern is not provided,
wherein the at least one micro-pixel includes at least one pixel circuit configured to supply a driving current to the plurality of inorganic light emitting elements,
wherein the plurality of micro-pixel packages are electrically connected to the transparent substrate by solder balls, and
wherein a height of each of the solder balls is greater than a height of the at least one micro-pixel IC such that the at least one micro-pixel IC is not in contact with the transparent substrate,
wherein the each micro-pixel package further comprises:
an upper wiring provided on the first surface of the relay substrate and extending from the plurality of inorganic light emitting elements;
a lower wiring provided on the second surface of the relay substrate and extending from the at least one micro-pixel IC;
an upper connection pad provided on an edge of the first surface of the relay substrate;
a lower connection pad provided on an edge of the second surface of the relay substrate; and
a side wiring formed on a side of the relay substrate to connect the upper connection pad and the lower connection pad, and
wherein the plurality of inorganic light emitting elements provided on the first surface of the relay substrate are electrically connected to the at least one micro-pixel IC provided on the second surface of the relay substrate through the upper wiring, the upper connection pad, the side wiring the lower connection pad, and the lower wiring.

13. The transparent display apparatus of claim 12, wherein the plurality of inorganic light emitting elements constitute a plurality of pixels that are two-dimensionally arranged,
wherein each of the plurality of pixels comprises two or more inorganic light emitting elements among the plurality of inorganic light emitting elements.

14. The transparent display apparatus of claim 13, wherein the at least one micro-pixel IC corresponds to the plurality of pixels, respectively, and
the plurality of inorganic light emitting elements are supplied with the driving current from a corresponding micro-pixel IC.

15. A transparent display module, comprising:
a transparent substrate;
a line pattern provided on the transparent substrate in a form of a two-dimensional grid;
a plurality of micro-pixel packages, each micro-pixel package comprising a relay substrate,
at least one micro-pixel integrated circuit (IC) provided on the line pattern and a plurality of inorganic light emitting elements provided on the at least one micro-pixel (IC) in which:
the plurality of inorganic light emitting elements are provided on a first surface of the relay substrate and the at least one micro-pixel IC is provided on a second surface of the relay substrate that is opposite to the first surface of the relay substrate, and
a plurality of transparent areas formed in areas in which the line pattern is not provided,
wherein at least one pixel circuit is configured to supply a driving current to each inorganic light emitting element included in each micro-pixel package,
wherein the plurality of micro-pixel packages are electrically connected to the transparent substrate by solder balls, and wherein a height of each of the solder balls is greater than a height of the at least one micro-pixel IC such that the at least one micro-pixel IC is not in contact with the transparent substrate, wherein the each micro-pixel package further comprises:
   an upper wiring provided on the first surface of the relay substrate and extending from the plurality of inorganic light emitting elements;
   a lower wiring provided on the second surface of the relay substrate and extending from the at least one micro-pixel IC;
   an upper connection pad provided on an edge of the first surface of the relay substrate;
   a lower connection pad provided on an edge of the second surface of the relay substrate; and
   a side wiring formed on a side of the relay substrate to connect the upper connection pad and the lower connection pad, and wherein the plurality of inorganic light emitting elements provided on the first surface of the relay substrate are electrically connected to the at least one micro-pixel IC provided on the second surface of the relay substrate through the upper wiring, the upper connection pad, the side wiring, the lower connection pad, and the lower wiring.

* * * * *